(12) United States Patent
Ohsawa

(10) Patent No.: US 7,425,746 B2
(45) Date of Patent: *Sep. 16, 2008

(54) SEMICONDUCTOR STORAGE DEVICE AND SEMICONDUCTOR INTEGRATED CIRCUIT

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

This patent is subject to a terminal disclaimer.

(21) Appl. No.: 11/339,469

(22) Filed: Jan. 26, 2006

(65) Prior Publication Data

US 2006/0131660 A1  Jun. 22, 2006

Related U.S. Application Data

(63) Continuation of application No. 10/682,950, filed on Oct. 14, 2003, now Pat. No. 7,023,054.

(30) Foreign Application Priority Data

Jun. 30, 2003   (JP)   ............... 2003-188413

(51) Int. Cl.
    *H01L 29/76*   (2006.01)
(52) U.S. Cl. ...................... 257/369; 257/368
(58) Field of Classification Search ................. 257/369, 257/368, 350
    See application file for complete search history.

(56) References Cited

U.S. PATENT DOCUMENTS

| 5,294,821 | A |   | 3/1994  | Iwamatsu |
| 5,359,219 | A |   | 10/1994 | Hwang |
| 5,576,995 | A | * | 11/1996 | Sato et al. ............. 365/185.27 |
| 6,043,536 | A |   | 3/2000  | Numata et al. |
| 6,140,161 | A |   | 10/2000 | Kumagai |
| 6,157,575 | A |   | 12/2000 | Choi |
| 6,314,021 | B1 |  | 11/2001 | Maeda et al. |
| 6,388,936 | B2 |  | 5/2002  | Itoh et al. |
| 6,403,435 | B1 |  | 6/2002  | Kang et al. |
| 6,424,016 | B1 |  | 7/2002  | Houston |
| 6,534,867 | B1 |  | 3/2003  | Kamiya et al. |

(Continued)

FOREIGN PATENT DOCUMENTS

EP          1 280 205         1/2003

(Continued)

*Primary Examiner*—Thao P. Le
(74) *Attorney, Agent, or Firm*—Oblon, Spivak, McClelland, Maier & Neustadt, P.C.

(57) ABSTRACT

A semiconductor storage device according to the present invention, comprising: a first semiconductor layer formed on a substrate via a buried insulation layer; an FBC (Floating Body Cell) having a channel body of floating type formed on the first semiconductor layer, a main gate which forms a channel at a first face side of the channel body, and an auxiliary gate formed to capacitively couple on a second face at an opposite side of the first face; a logic circuit formed on the first semiconductor layer, separate from the FBC by an insulation film, which transfers a signal for the FBC; a second semiconductor layer which locates below the FBC and is formed along an under face of the buried insulation film; and a third semiconductor layer which locates below the logic circuit and is formed along an under face of the buried insulation film, wherein the second and third semiconductor layers are set to be in a potential different from each other.

12 Claims, 26 Drawing Sheets

U.S. PATENT DOCUMENTS

| | | |
|---|---|---|
| 6,562,666 B1 | 5/2003 | Park et al. |
| 2002/0051378 A1 | 5/2002 | Ohsawa |
| 2002/0110018 A1 | 8/2002 | Ohsawa |
| 2002/0190322 A1 | 12/2002 | Mouli |
| 2003/0015757 A1 | 1/2003 | Ohsawa |

FOREIGN PATENT DOCUMENTS

| | | |
|---|---|---|
| JP | 4-146628 | 5/1992 |
| JP | 4-146672 | 5/1992 |
| JP | 4-146673 | 5/1992 |
| JP | 4-196173 | 7/1992 |
| JP | 4-196478 | 7/1992 |
| JP | 9-223802 | 8/1997 |
| JP | 10-340963 | 12/1998 |
| JP | 2001-127300 | 5/2001 |
| JP | 2001-177098 | 6/2001 |
| JP | 2002-164544 | 6/2002 |
| JP | 2002-246571 | 8/2002 |
| JP | 2003-31693 | 1/2003 |
| JP | 2003-86712 | 3/2003 |

* cited by examiner

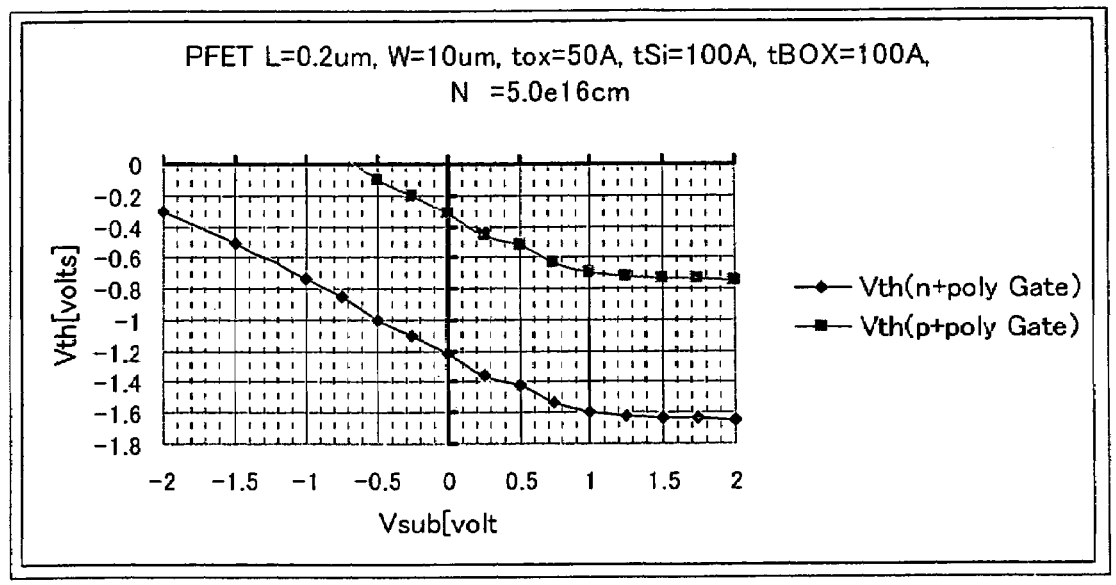
F I G. 11

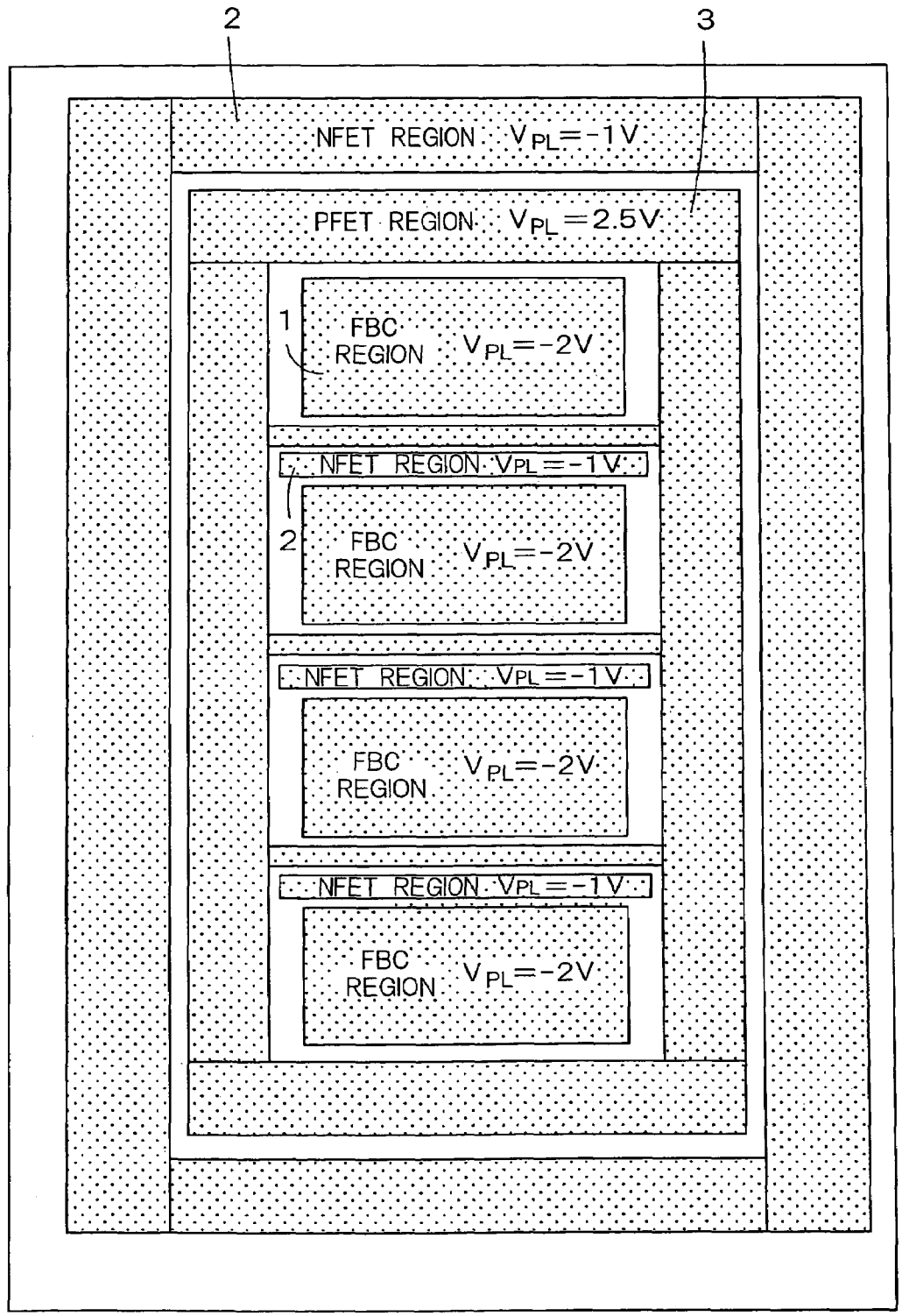
F I G. 17

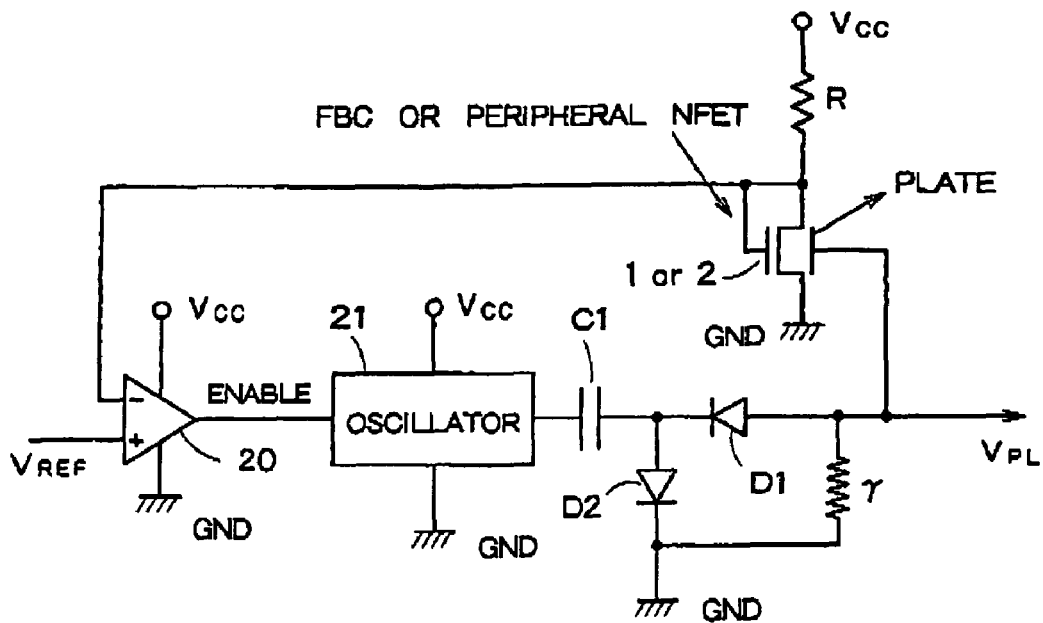
F I G. 24
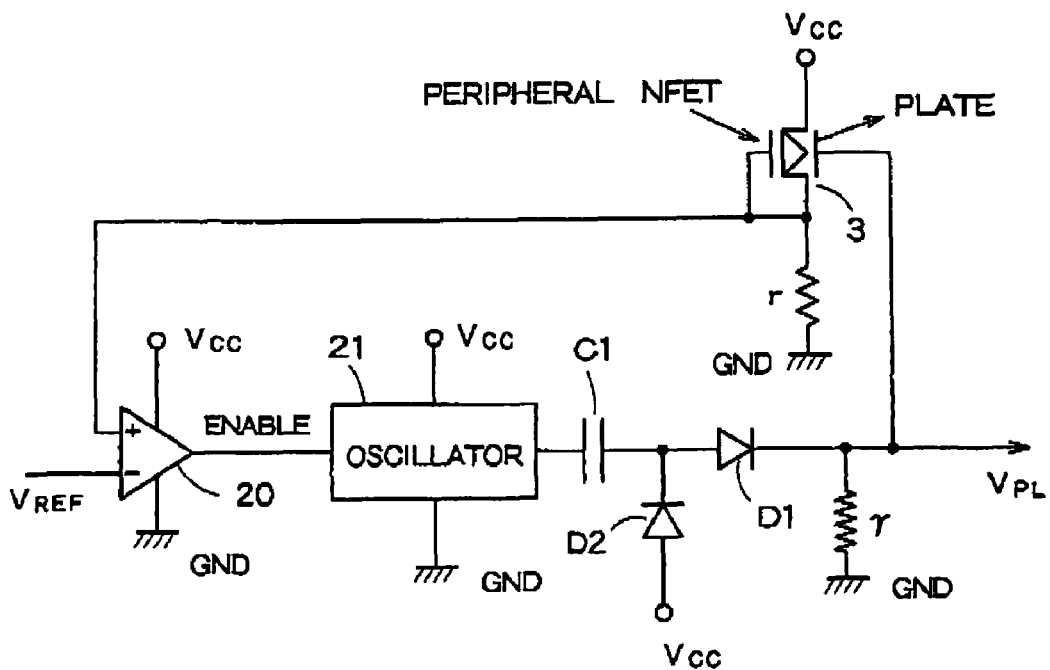
F I G. 25

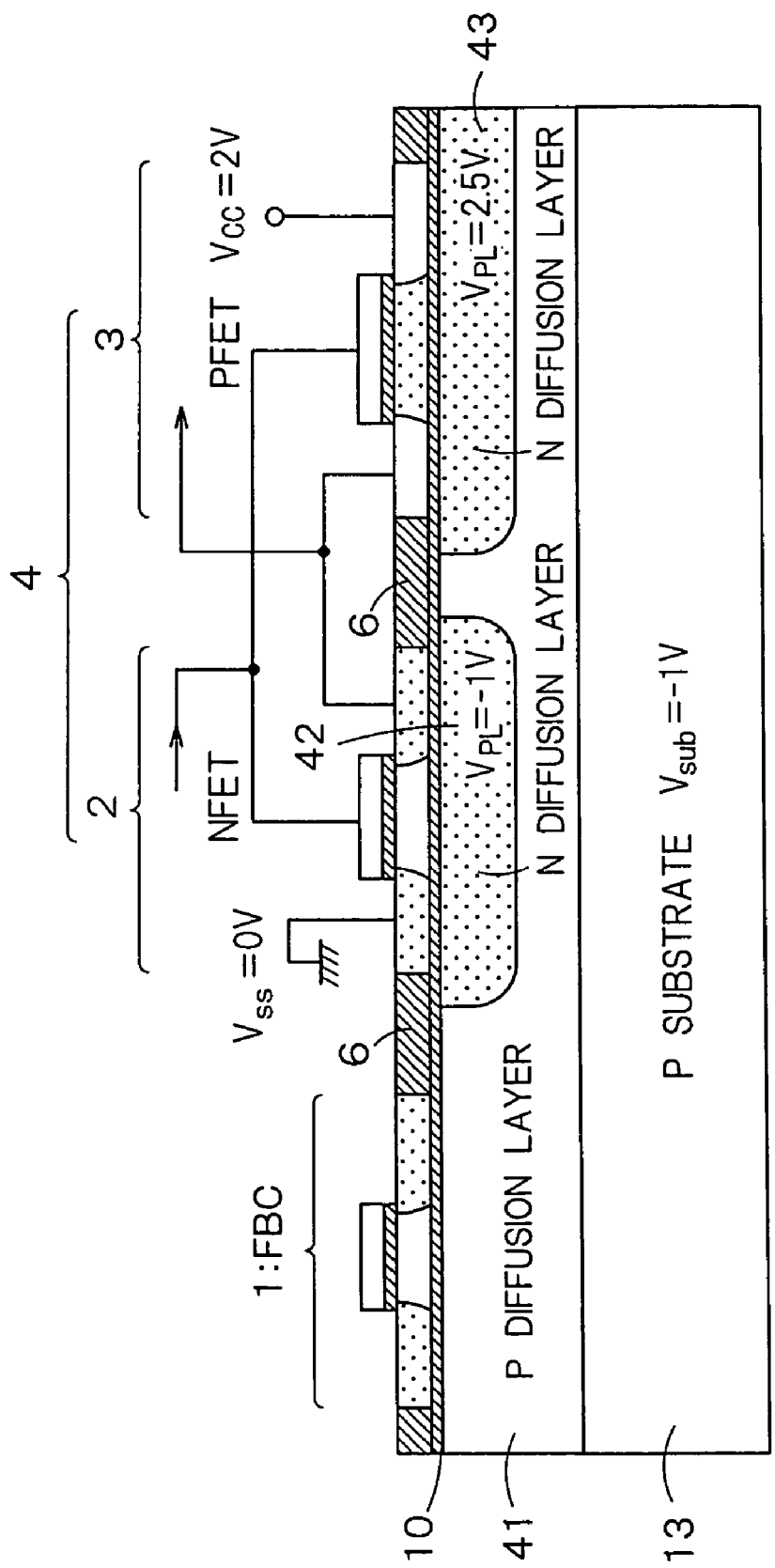
F I G. 29

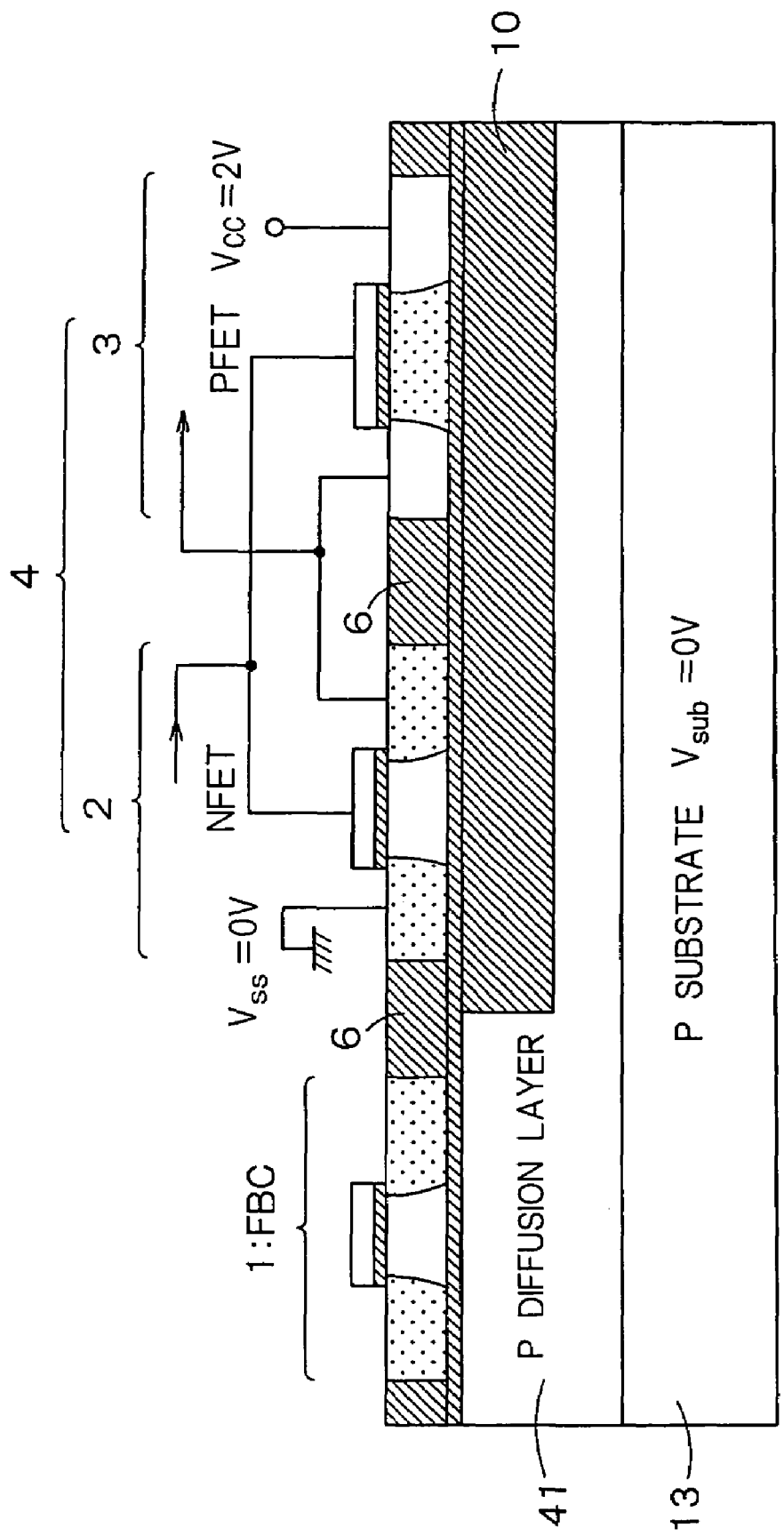
F I G. 32

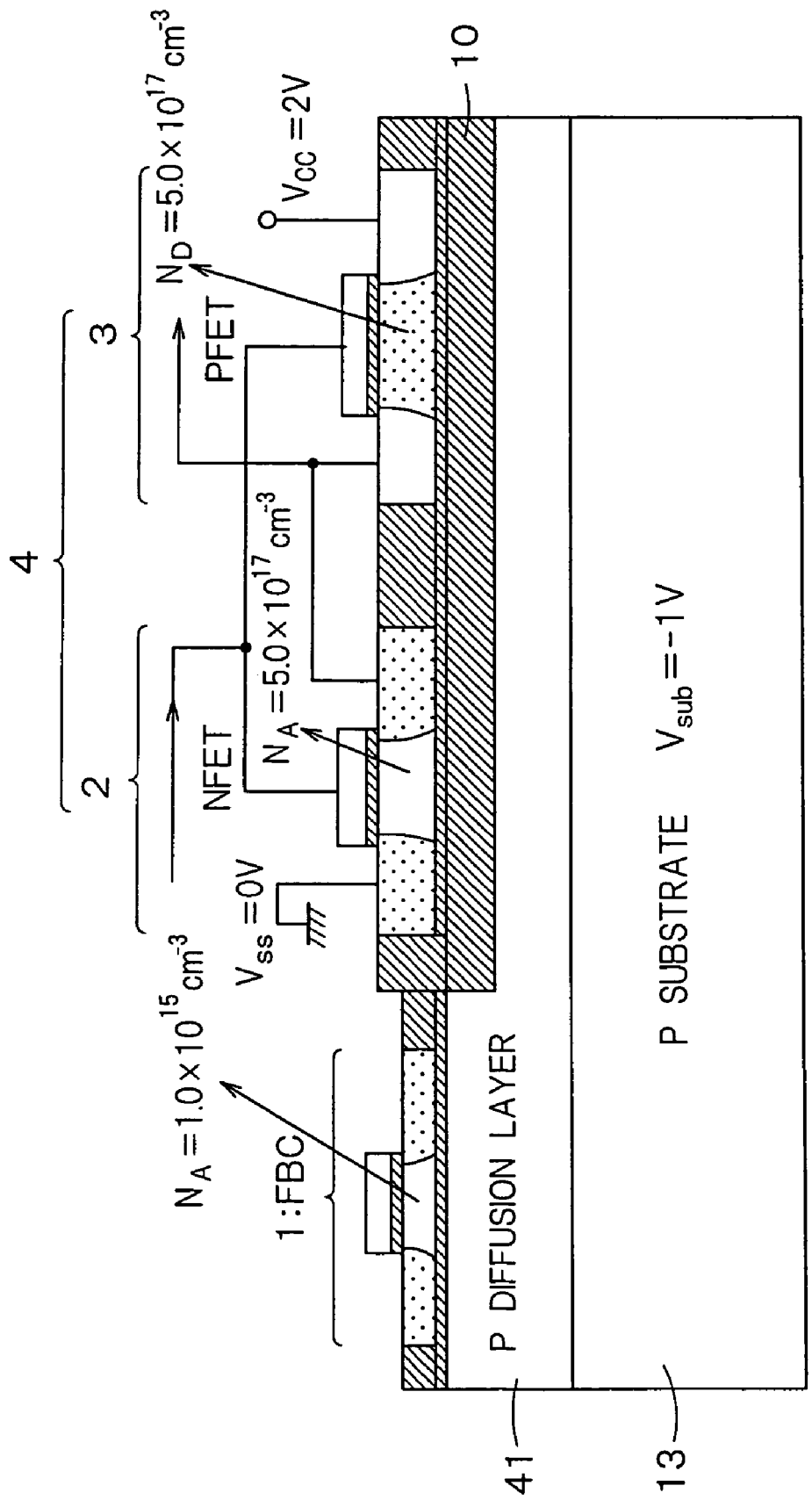
F I G. 34

SEMICONDUCTOR STORAGE DEVICE AND SEMICONDUCTOR INTEGRATED CIRCUIT

CROSS REFERENCE TO RELATED APPLICATIONS

This application is a continuation of U.S. application Ser. No. 10/682,950 filed Oct. 14, 2003, and claims benefit of priority under 35 U.S.C. §119 to Japanese Patent Application No. 2003-188413, filed on Jun. 30, 2003, the entire contents of each of which are incorporated by reference herein.

BACKGROUND OF THE INVENTION

1. Field of the Invention

The present invention relates to a semiconductor storage device and a semiconductor integrated circuit and, more particularly, to an FBC (Floating Body Cell) memory for storing information by accumulating majority carriers in a floating body of a field effect transistor (FET).

2. Related Art

It is concerned that as a DRAM cell constructed by a conventional one transistor and one capacitor having a trench capacitor and a stacked capacitor is becoming smaller, it is becoming difficult to fabricate the DRAM cell. As a memory cell which can replace such a DRAM cell, a new memory cell, an FBC, for storing information by accumulating majority carriers in a floating channel body of an FET formed on a silicon on insulator (SOI) or the like has been proposed (refer to Japanese Unexamined Patent Application Nos. 2003-68877 and 2002-246571).

An FBC has a main gate for forming a channel on the top face side of a channel body and an auxiliary gate formed so as to be capacitively coupled on the under face side.

There are a memory cell which is formed on a partially depleted SOI (PD-SOI) (refer to Japanese Patent Publication Laid-Open Nos. 2003-68877 and 2002-246571) and a memory cell which is formed on a fully depleted SOI (FD-SOI) (refer to Japanese Patent Publication Laid-Open No. 2003-31693). The latter memory cell is an FBC which is applicable even to a situation such that a transistor is becoming smaller and a silicon film of an SOI is becoming thinner.

In an FBC, generally, a fixed capacity is necessary for the channel body in order to assure a memory signal amount. One of options is a method of forming a buried oxide film (BOX) thinly and providing the capacitance between the channel body and a substrate. The potential of the substrate right below an FBC array is requested to be a negative potential so that holes can be accumulated in the channel body.

However, when the potential of the substrate under a transistor in a peripheral circuit, particularly, a PFET in the peripheral circuit becomes a negative potential, since the buried oxide film is thin, a back channel of the PFET is turned on and it causes a problem such that a normal transistor operation is disturbed.

On the other hand, in the case of forming an FBC on an FD-SOI, it is unclear how to design a transistor of a logic circuit in the case where both a peripheral circuit of a memory and an FBC memory are mounted.

Particularly, when both a P-type FET (PFET) and an N-type FET (NFET) are formed on a very thin silicon film and a substrate voltage is set to 0V in a normal fashion, and the absolute value of the threshold voltage of a PFET of an N-type polysilicon gate is too high, an NFET becomes a depletion type (a field effect transistor having a negative threshold voltage), so that practical use becomes impossible. Since the threshold voltages change depending on the thickness of a silicon film, in the case of a very thin silicon film, a subtle change in the thickness of the silicon film results in a large change in a threshold voltage, and it causes a problem such that a stable operation of the device is disturbed.

SUMMARY OF THE INVENTION

A semiconductor storage device according to an embodiment of the present invention, comprising:

a first semiconductor layer formed on a substrate via a buried insulation layer;

an FBC (Floating Body Cell) having a channel body of floating type formed on said first semiconductor layer, a main gate which forms a channel at a first face side of said channel body, and an auxiliary gate formed to capacitively couple on a second face at an opposite side of said first face;

a logic circuit formed on said first semiconductor layer, separate from said FBC by an insulation film, which transfers a signal for said FBC;

a second semiconductor layer which locates below said FBC and is formed along an under face of said buried insulation film; and a third semiconductor layer which locates below said logic circuit and is formed along an under face of said buried insulation film, wherein said second and third semiconductor layers are set to be in a potential different from each other.

Furthermore, a semiconductor storage device according to an embodiment of the present invention, comprising:

a first semiconductor layer formed on a substrate via a buried insulation film;

an FBC (Floating Body Cell) having a channel body of floating type formed on said first semiconductor layer, a main gate which forms a channel at a first face side of said channel body, and an auxiliary gate formed to capacitively couple on a second face at an opposite side of said first face; and a logic circuit formed on said first semiconductor layer, separate from said FBC by said an insulation film, which transfers a signal for said FBC, wherein a thickness of said buried insulation film below said logic circuit is thicker than that of said buried insulation below said FBC.

Furthermore, semiconductor storage device according to an embodiment of the present invention, comprising:

a first semiconductor layer formed on a substrate via a buried insulation film;

a FBC (Floating Body Cell) having a channel body of floating type formed on said first semiconductor layer, a main gate which forms a channel at a first face side of said channel body, and an auxiliary gate formed to capacitively couple on a second face at an opposite face of said first face;

a logic circuit formed on said first semiconductor layer, separate from said FBC by said insulation film, which transfers a signal for said FBC; and a plurality of polysilicon layers or metal layers formed separate from each other inside said buried insulation film in accordance with said FBC and said logic circuit.

Furthermore, a semiconductor integrated circuit according to an embodiment of the present invention, comprising:

a first semiconductor layer formed on a substrate via a buried insulation film;

a CMOS circuit having a PMOSFET and an NMOSFET formed separate from each other on said first semiconductor layer;

a second semiconductor layer which locates below said PMOSFET, and is formed along an under face of said buried insulation film; and a third semiconductor layer which locates below said NMOSFET, and is formed separate from said second semiconductor film, along the under face of said buried insulation film, wherein said second and third semiconductor layers are set to be in a potential different from each other in which backgates of said PMOSFET and said NMOSFET does not turn on.

BRIEF DESCRIPTION OF THE DRAWINGS

FIG. 11 is a diagram showing a result of simulation of characteristics of a PFET 3 of an N-type polysilicon gate and a PFET 3 of a P-type polysilicon gate in a peripheral circuit 4 formed on an FD-SOI.

FIG. 17 is a diagram showing a layout of a silicon chip formed by an SOI wafer 5.

FIG. 24 is a circuit diagram showing a case of automatically adjusting the plate voltage within the chip.

FIG. 25 is a circuit diagram showing a case of automatically adjusting the plate voltage within the chip.

FIG. 29 is a cross section showing a third embodiment of the semiconductor storage device according to the invention.

FIG. 32 is a cross section showing a sixth embodiment of the semiconductor storage device according to the invention.

FIG. 34 is a cross section showing a case where the concentration of a channel body of the FBC 1 is set to $N^d=1.0\times 10^{15}$ cm$^{-3}$, the concentration of a channel body of an NFET 2 is set to $N_A=5.0\times 10^{17}$ cm$^{-3}$, and the concentration of a channel body of a PFET 3 is set to $N_D=5.0\times 10^{17}$ cm$^{-3}$.

DESCRIPTION OF THE PREFERRED EMBODIMENTS

A semiconductor storage device and a semiconductor integrated circuit according to the invention will be concretely described hereinbelow with reference to the drawings.

First Embodiment

Figure 1:
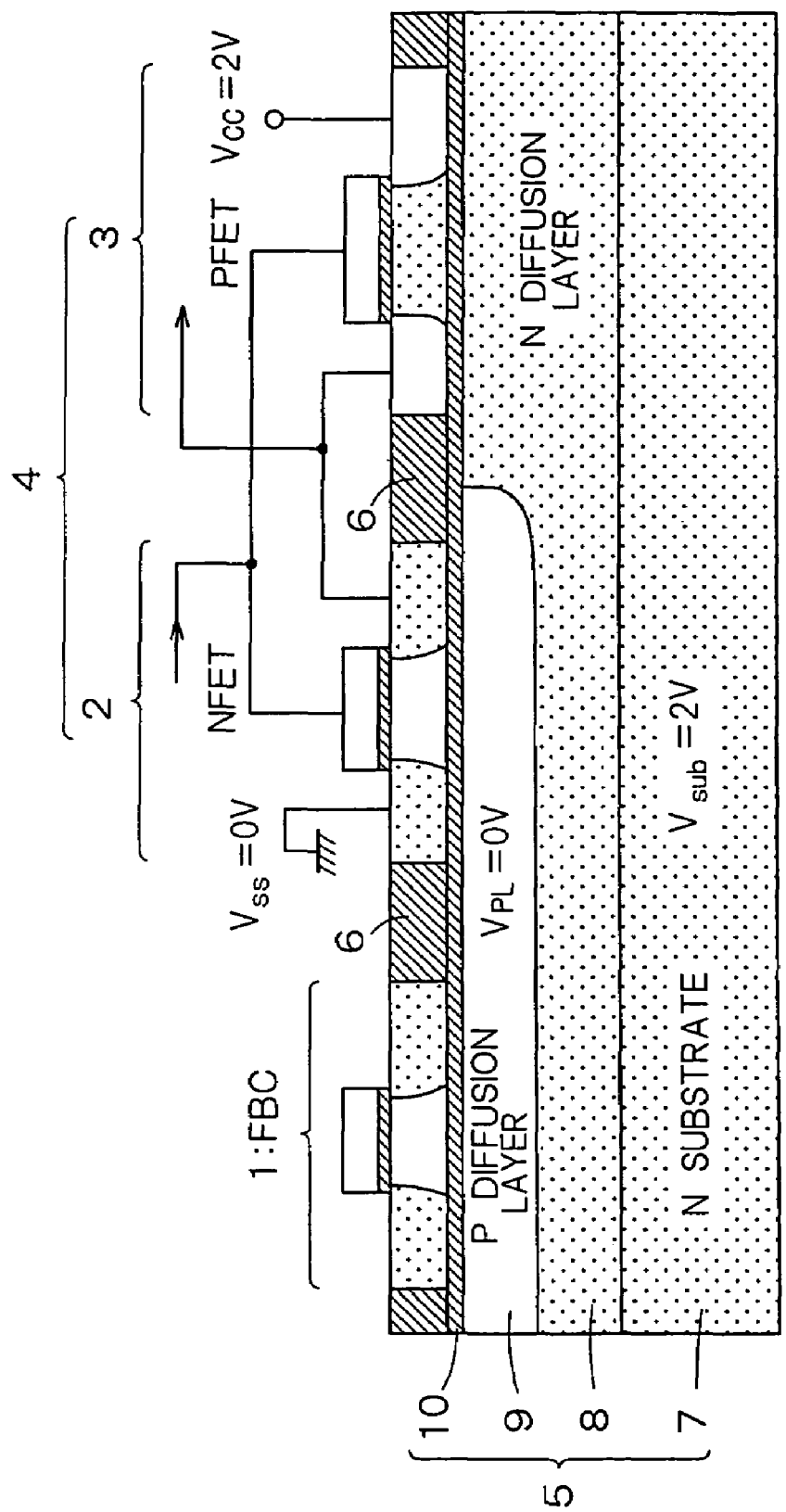
FIG. 1 is a cross section showing a first embodiment of a semiconductor storage device according to the invention.

FIG. 1 is a cross section showing a first embodiment of a semiconductor storage device according to the invention. The semiconductor storage device of FIG. 1 is obtained by forming an FBC (Floating Body Cell) 1 and a peripheral circuit 4 having an N-type MOSFET (hereinbelow, NFET) 2 and a P-type MOSFET (hereinbelow, PFET) 3 so as to be isolated from each other by an insulation layer 6 on a partially depleted SOI (Silicon On Insulator) board 5.

The SOI board 5 has an N-type diffusion layer 8 formed on an N-type silicon wafer (N wafer) 7, a P-type diffusion layer 9 formed in a part of the N diffusion layer 8, and a thin buried oxide film 10 formed on the top faces of the N diffusion layer 8 and the P diffusion layer 9. On the top face of the buried oxide film 10, the FBC 1, NFET 2, and PFET 3 are formed.

The P diffusion layer 9 is formed below the FBC 1 and the NFET 2. The potentials Vsub of the N wafer 7 and the N diffusion layer 8 are equal to 2V, and the potential $V_{PL}$ of the P diffusion layer 9 is set to 0V.

Figure 2:
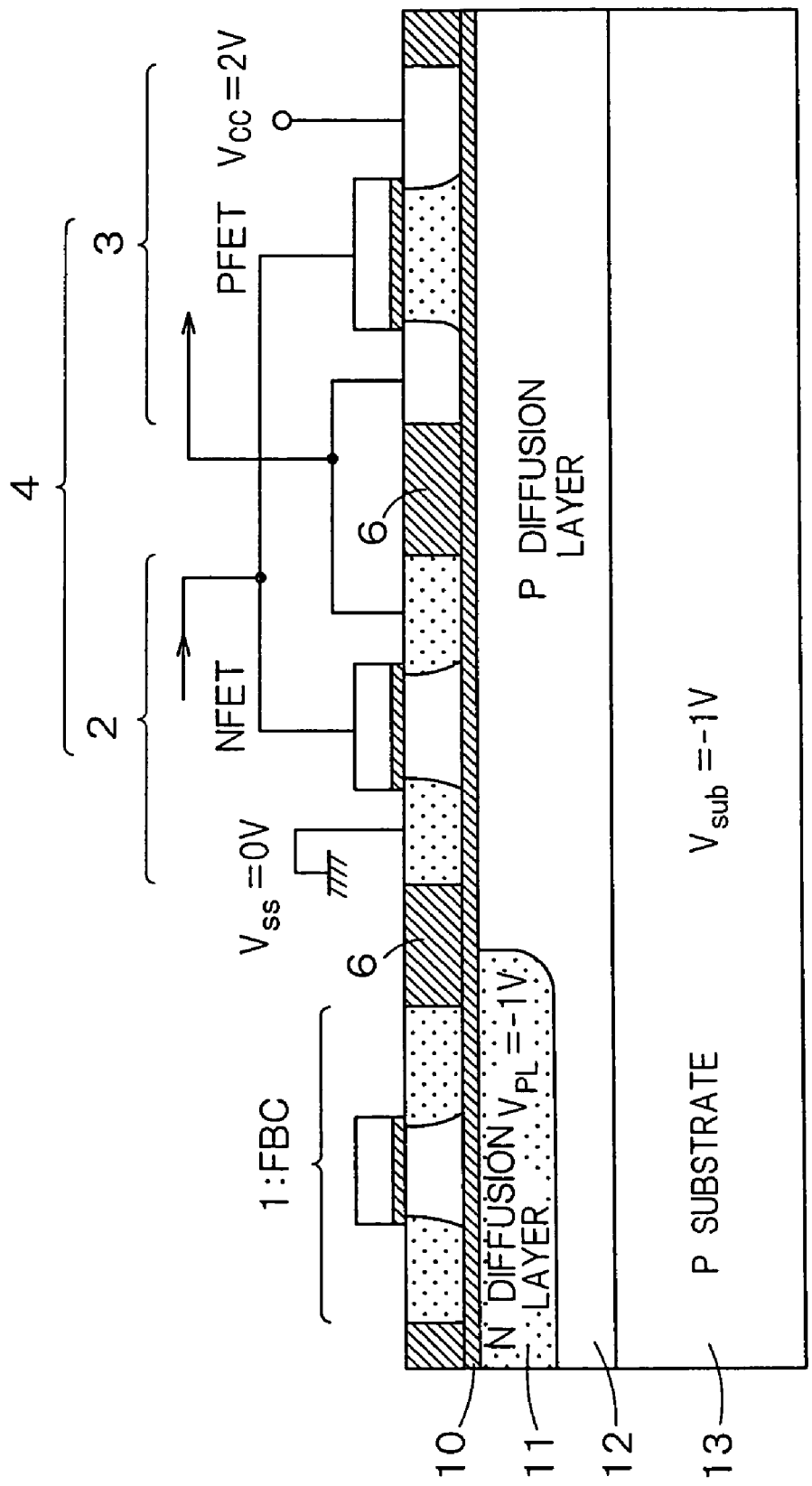
FIG. 2 is a diagram showing a sectional structure of the semiconductor storage device in which an N diffusion layer 11 is formed below an FBC 1 and a P diffusion layer 12 is formed below an NFET 2 and a PFET 3.

FIG. 2 is a diagram showing a sectional structure of the semiconductor storage device on the partially depleted SOI in which an N diffusion layer 11 is formed below the FBC 1 and a P diffusion layer 12 is formed below the NFET 2 and the PFET 3. The N diffusion layer 11 is formed in a part of the P diffusion layer 12. In the semiconductor storage device of FIG. 2, the potentials Vsub of a P wafer 13 under the P diffusion layer 12 and the P diffusion layer 12 are set to −1V, and the potential $V_{PL}$ of the N diffusion layer 8 is set to −1V.

In the case of FIG. 2, the potential of the P diffusion layer 12 is negative. Consequently, it is feared that a back channel of the PFET 3 constituting a part of the peripheral circuit 4 is turned on and an erroneous operation occurs.

On the other hand, in the semiconductor storage device of FIG. 1, the P diffusion layer 9 is disposed below the FBC 1 and the NFET 2, the N diffusion layer 8 is disposed below the PFET 3, the P diffusion layer 9 is set to 0V, and the N diffusion layer 8 is set to 2V. Consequently, there is no fear that the back channel of the NFET 2 and the PFET 3 is turned on, and no erroneous operation occurs.

Figure 3:
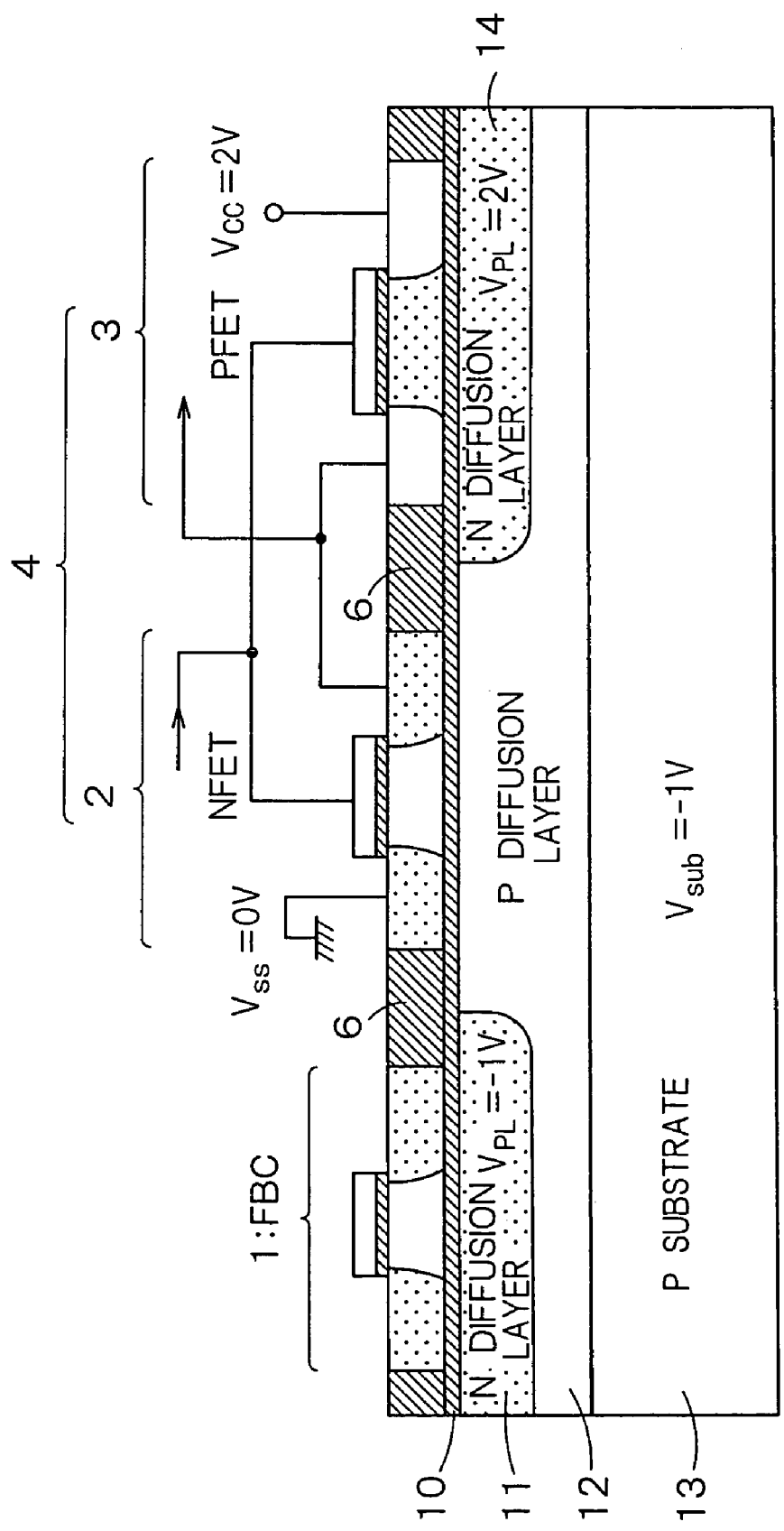
FIG. 3 is a cross section of a semiconductor storage device having the structure different from that of FIG. 1.

FIG. 3 is a cross section of a semiconductor storage device having a structure different from that of FIG. 1. In the semiconductor storage device on a partially depleted SOI of FIG. 3, the N diffusion layer 11 and an N diffusion layer 14 which are different from each other are disposed below the FBC 1 and the PFET 3, respectively. The N diffusion layers 11 and 14 are formed separate from each other in a part of the P diffusion layer 12 formed on the P wafer 13. The potential $V_{PL}$ of the N diffusion layer 11 below the FBC 1 is set to −1V, and the potential $V_{PL}$ of the N diffusion layer 14 below the PFET 3 is set to 2V.

Even in the semiconductor storage device of FIG. 3, there is no fear that the back channel of the PFET 3 and NFET 2 is turned on.

Figure 4:
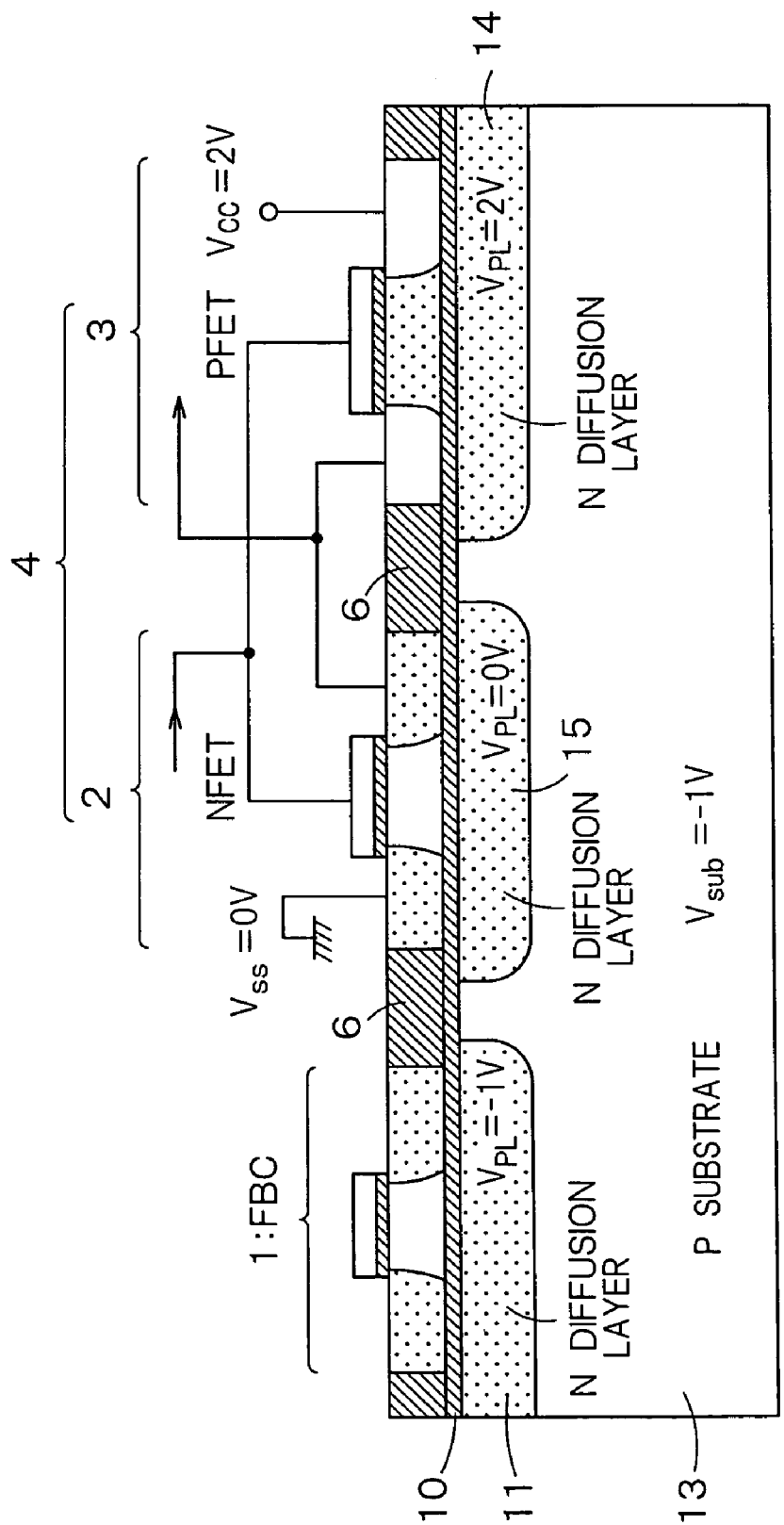
FIG. 4 is a cross section of a semiconductor storage device having the structure different from that of FIG. 3.

FIG. 4 is a cross section of a semiconductor storage device on a partially depleted SOI having the structure different from the structure of FIG. 3. In the semiconductor storage device of FIG. 4, N diffusion layers 11, 15, and 14 which are independent of each other are disposed below the FBC 1, NFET 2, and PFET 3, respectively. The N diffusion layers 11, 15, and 14 are formed separate from each other on the P wafer 13, and are set to different potentials. The potential $V_{PL}$ of the N diffusion layer 11 below the FBC 1 is set to −1V, the potential $V_{PL}$ of the N diffusion layer 15 below the NFET 2 is set to 0V, the potential $V_{PL}$ of the N diffusion layer 14 below the PFET 3 is set to 2V, and the potential Vsub of the P wafer 13 is set to −1V.

Even in the semiconductor storage device of FIG. 4, there is no fear that the back channel of the PFET 3 and NFET 2 is turned on.

In FIG. 4, also in the case of replacing the P wafer 13 with the N wafer 7 and replacing the N diffusion layers 11, 14, and 15 with P diffusion layers, similar effects are obtained. In this case, it is sufficient to set the potential of the P diffusion layer to be higher than that in FIG. 4 by 1V and set the potential of the N wafer 7 to 3V.

A fully depleted SOI in which a silicon layer on the surface is thin will be described hereinbelow.

Figure 5:
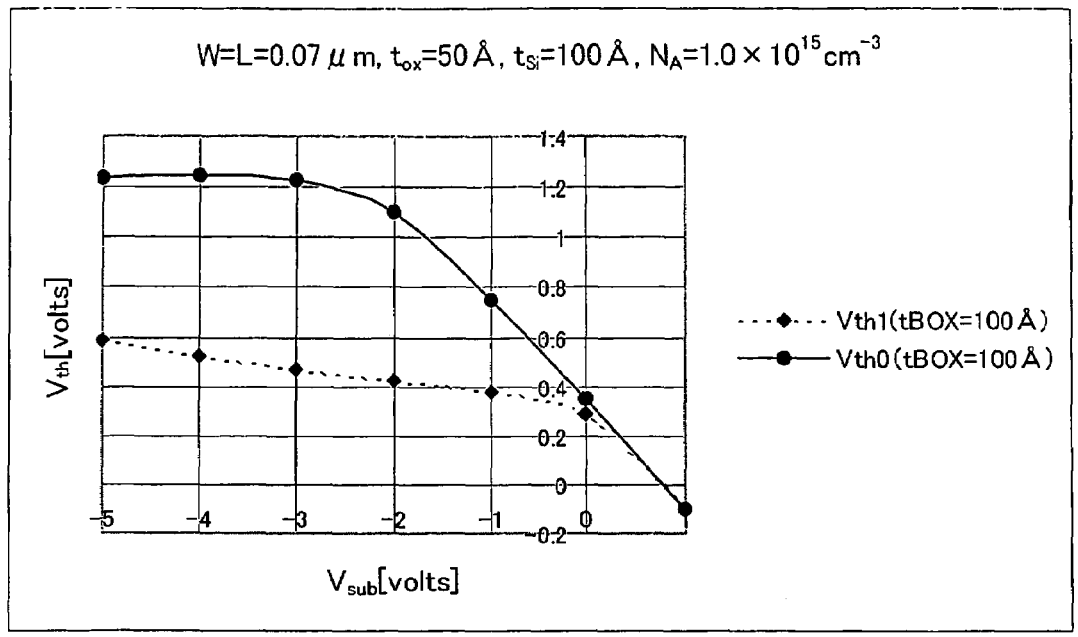
FIG. 5 is a diagram showing a result of simulation of characteristics of an FD-FBC (fully depleted FBC) formed by an NFET.

FIG. 5 is a diagram showing a result of simulation of characteristics of an FD-FBC (fully depleted FBC) formed by an NFET. In FIG. 5, L=0.07 μm, $t_{ox}$=50 Å (=5×10$^{-7}$ cm), $t_{si}$=100 Å (=10$^{-6}$ cm), $t_{BOX}$=100 Å (=10$^{-6}$ cm), and a P-type impurity concentration $N_A$ in the channel body=1.0×10$^{15}$ cm$^{-3}$, and the material of the gate is an N-type polysilicon.

From the results of simulation of FIG. 5, to increase the difference ΔVth between the threshold voltage Vth0 of the FBC 1. in which data "0" is stored and the threshold voltage Vth1 of the FBC 1 in which data "1" is stored, it is appropriate to apply a voltage of the substrate voltage Vsub of about −2V to the N diffusion layer which exists in the interface between the silicon substrate and the buried oxide film 10 and in which an impurity is doped so that the concentration becomes 1.0×10$^{19}$ cm$^{-3}$ to realize low resistance.

Figure 6:
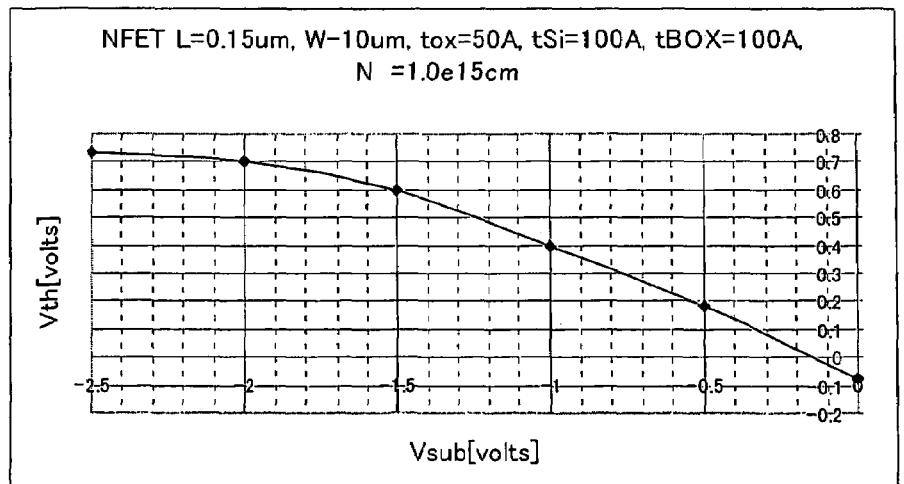
FIG. 6 is a diagram showing a result of simulation of an N-type polysilicon gate NFET of a peripheral circuit 4 formed on an FD-SOI.
Figure 7:
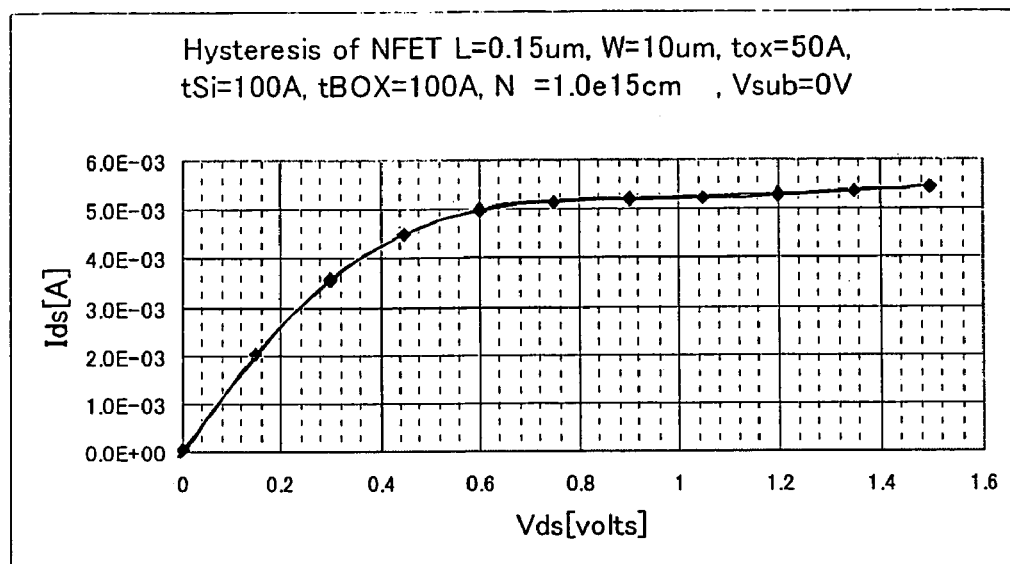
FIG. 7 is a diagram showing the presence or absence of a hysteresis of an NFET.
Figure 8:
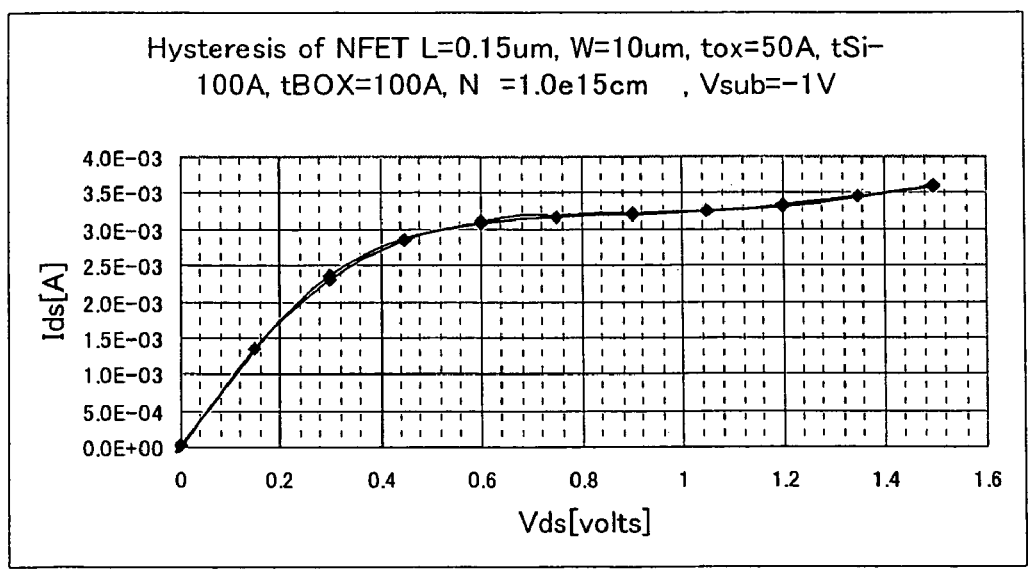
FIG. 8 is a diagram showing the presence or absence of a hysteresis of the NFET.
Figure 9:
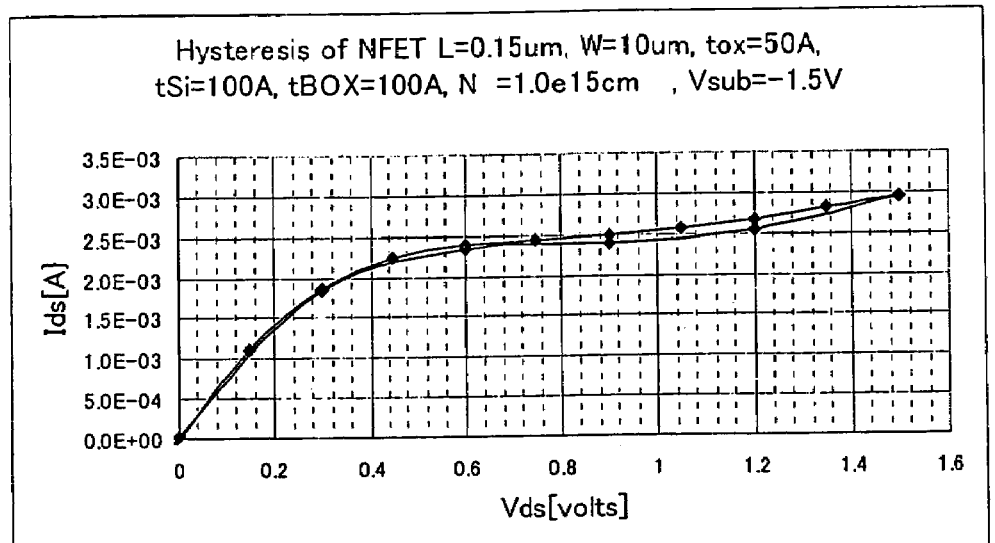
FIG. 9 is a diagram showing the presence or absence of a hysteresis of the NFET.
Figure 10:
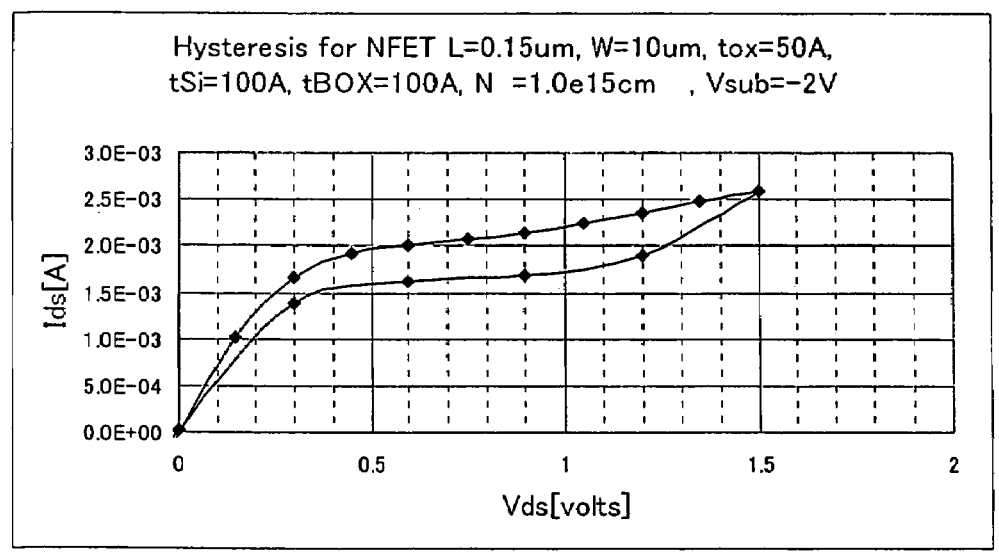
FIG. 10 is a diagram showing the presence or absence of a hysteresis of the NFET.
Figure 12:
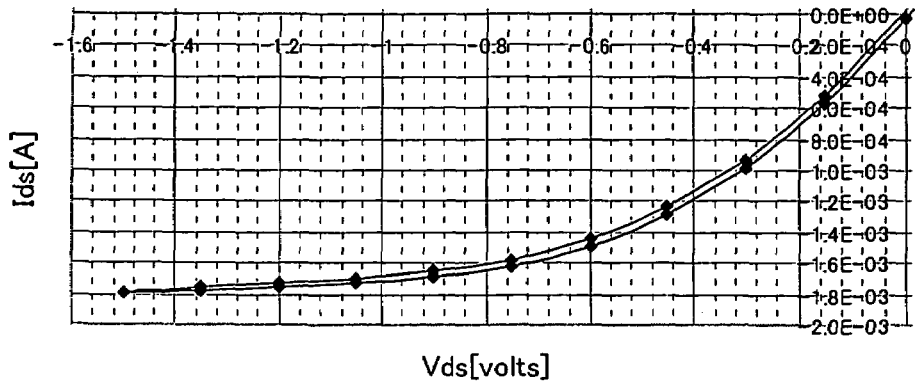
FIG. 12 is a diagram showing the presence or absence of a hysteresis of a PFET.
Figure 13:
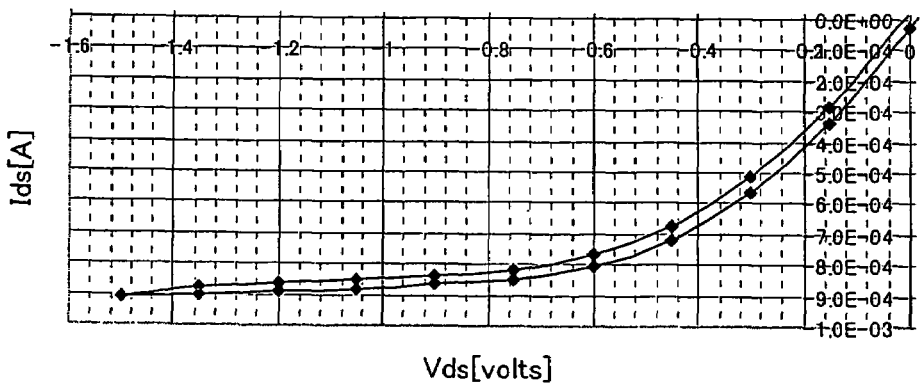
FIG. 13 is a diagram showing the presence or absence of a hysteresis of the PFET.
Figure 14:
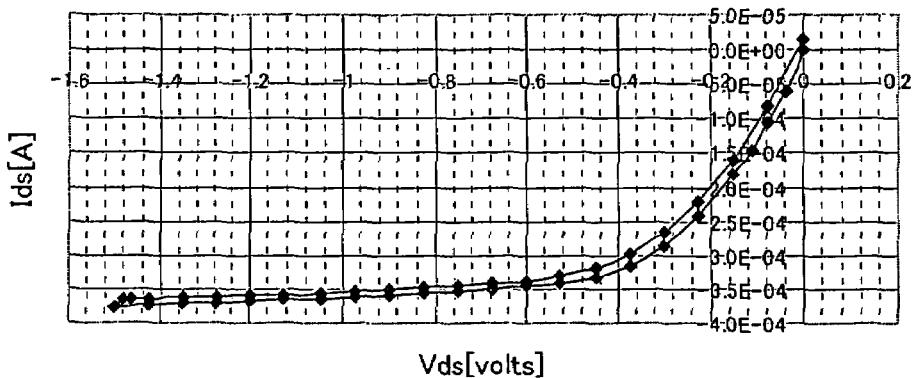
FIG. 14 is a diagram showing the presence or absence of a hysteresis of the PFET.
Figure 15:
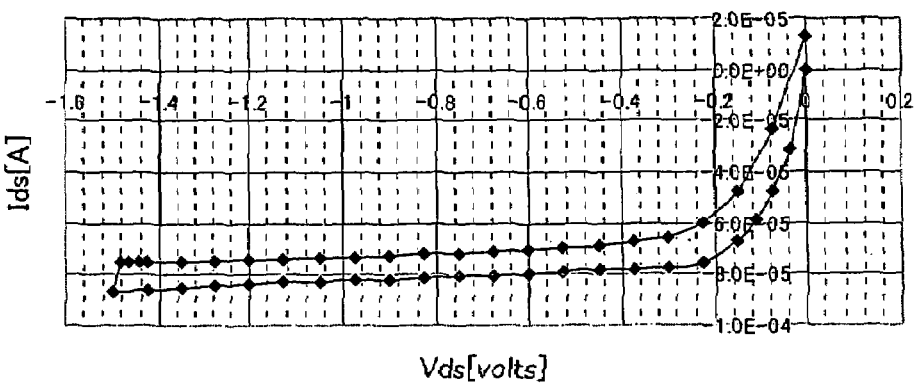
FIG. 15 is a diagram showing the presence or absence of a hysteresis of the PFET.

FIG. 6 is a diagram showing a result of simulation of an N-type polysilicon gate NFET of the peripheral circuit 4 formed on the FD-SOI. In FIG. 6, it is assumed that L=0.15 μm, $t_{ox}$=50 Å (=5×10$^{-7}$ cm), $t_{si}$=100 Å (=10$^{-6}$ cm), $t_{BOX}$=100 Å (=10$^{-6}$ cm), and $N_A$=1.0×10$^{15}$ cm$^{-3}$.

FIG. 6 shows, in a manner similar to FIG. 5, the relation between the substrate voltage Vsub and the threshold voltage Vth of the NFET having L=0.15 μm and W=10 μm and having the N diffusion layer which exists in the interface between the silicon wafer and the buried oxide film (BOX) 10 and in which an impurity is doped so that the concentration becomes 1.0×10$^{19}$ cm$^{-3}$ to realize low resistance. When Vsub=0V, since the transistor is the depletion type (having a negative threshold voltage), the transistor cannot be used. Therefore, in order to set the threshold voltage Vth to a preferable value of 0.4 to 0.5V, the Vsub has to be set to about −1.0V to −1.2V.

In the case of using a thin film transistor on the SOI as a peripheral transistor, attention has to be paid not only to the absolute value itself of the threshold value but also the hysteresis of a drain current.

Also in the case of forming a transistor on a PD-SOI in which the silicon film is thick or the concentration of an impurity in the channel body is high, such hysteresis of a drain current is seen. In the case of the PD-SOI, to prevent the hysteresis, it is sufficient to provide a contact to fix the potential of the channel body.

On the other hand, although it is said that a transistor on the FD-SOI does not have hysteresis as seen in a transistor on the PD-SOI, depending on the value of the substrate potential Vsub, there is the possibility that majority carries are accumulated on the interface between the buried oxide film 10 and the substrate. Consequently, hysteresis may occur.

In a transistor on the FD-SOI, however, it is impossible to form a contact in the channel body unlike in the case of the PD-SOI to prevent hysteresis for the reason that a charge neutral area does not exist in the channel body.

Therefore, in the case of changing the substrate potential to adjust the threshold voltage of a transistor formed on the FD-SOI, whether or not hysteresis of a drain current occurs at the substrate potential has to be checked.

FIGS. 7 to 10 are diagrams indicating whether or not hysteresis occurs in the drain current of the NFET 2 having the above-described structure in the case where the drain voltage is increased from 0V to 1.5V and is decreased from 1.5V to 0V. FIGS. 7 to 10 show the states of hysteresis in the case where Vsub=0V, −1.0V, −1.5V, and −2V, respectively.

From the diagrams, it is understood that hysteresis occurs at the substrate potential Vsub of −1.5V or lower, and the transistor characteristics become unstable. Since Vsub is set to −1.0 to −1.2V in the setting of the threshold voltage (Vth=0.4 to 0.5V), it is therefore understood that hysteresis does not occur in the transistor in this range and the transistor operates stably.

FIG. 11 is a diagram showing a result of simulation of characteristics of the N-type polysilicon gate PFET 3 and the P-type polysilicon gate PFET 3 in the peripheral circuit 4 formed on the FD-SOI. In FIG. 11, it is assumed that L=0.2 μm, $t_{ox}$=50 Å (=5×10$^{-7}$ cm), $t_{si}$=100 Å (=10$^{-6}$ μm), $t_{BOX}$=100 Å (=10$^{-6}$ cm), and $N_D$ (concentration of an N-type impurity in the channel body)=5.0×10$^{16}$ cm$^{-3}$. In a manner similar to the FBC 1, it is assumed that an N-type diffusion layer in which an impurity is doped to 1.0×10$^{19}$ cm$^{-3}$ in order to achieve low resistance is provided on the interface of the silicon wafer and the buried oxide film (BOX) 10.

FIG. 11 shows dependency on the substrate voltage $V_{sub}$ of the threshold voltage of the PFET 3 in the peripheral circuit 4. In the case of the N-type polysilicon gate PFET 3, when $V_{sub}$, =0V, the threshold voltage is −1.2V and is too high to be used. On the other hand, in the case of the P-type polysilicon gate PFET 3, it is understood that the Vth value is proper at the voltage Vsub of 0V or higher. It should be noted that Vsub=0 denotes the source potential of the PFET 3 (the source or drain having a higher potential).

Also in the case of the PFET 3, in a manner similar to the case of the NFET 2, there is the possibility that hysteresis occurs in the drain current. Consequently, it is necessary to make sure that hysteresis does not occur in the set substrate potential range.

FIGS. 12 to 15 are diagrams indicating whether hysteresis occurs or not in the PFET 3 and show the case where Vsub =−1V, 0V, 1V, and 2V, respectively.

As shown in FIGS. 12 to 15, in the PFET 3 of the structure, hysteresis occurs only when Vsub>1V, so that Vsub is set to be equal to or higher than 0 (Vsub≧0) in setting of the threshold voltage of the P-type polysilicon PFET 3 (Vth =−0.7 to −0.3V). It is understood that when the Vsub is regulated in the range from 0V to 1V, hysteresis does not occur in the transistor and the transistor operates stably.

Figure 16:
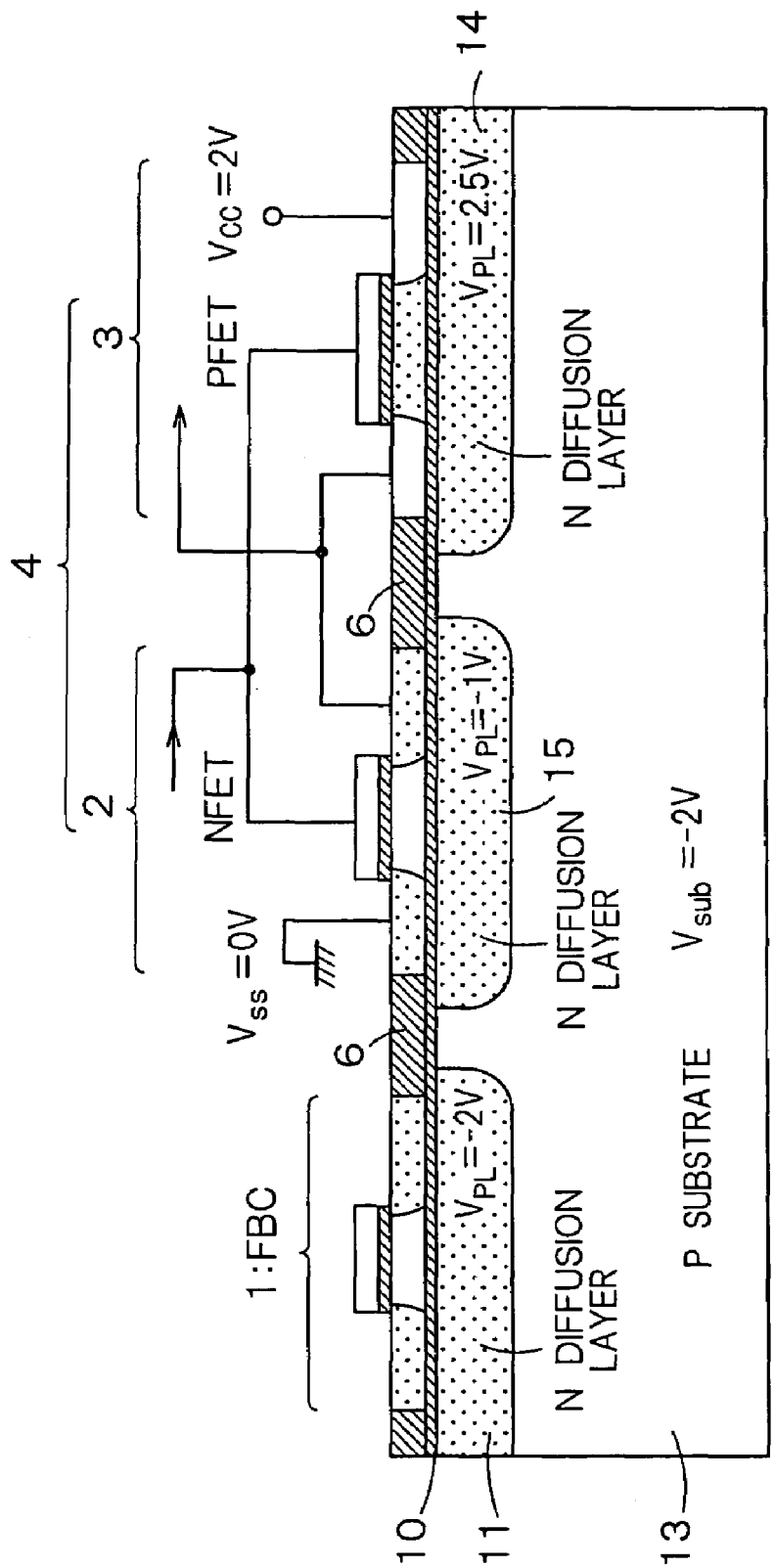
FIG. 16 is a cross section of a semiconductor storage device in which an N-diffusion layer is disposed for each of an FBC, an NFET, and a PFET.

After the optimum plate potentials of the FBC 1, NFET 2, and PFET 3 are determined by the above procedure, to apply the plate voltages to the SOI transistor on the same substrate, the substrate configuration as shown in FIG. 16 is considered.

In the semiconductor storage device of FIG. 16, the N diffusion layers 11, 15, and 14 for realizing low resistance are formed in the boundary between the substrate under the FBC 1, NFET 2, and PFET 3 and the buried oxide film 10, and the N diffusion layers 11, 15, and 14 are separated from each other. To the N diffusion layers 11, 15, and 14, the above-described optimum substrate potential, in this case, the plate potential $V_{PL}$ is applied.

In FIG. 16, $V_{PL}$ is set to −2V for the N diffusion layer under the FBC 1, $V_{PL}$ is set to −1V for the N diffusion layer under the NFET 2, and $V_{PL}$ is set to 2.5V for the N diffusion layer under the PFET 3. The P-type substrate is set to the lowest value among these potentials to prevent that the PN junction is forward-biased and heavy current flows. In this case, Vsub is set to −2V. By the setting, all of PN junctions existing between the substrate and the N diffusion layers are reverse-biased, so that no heavy current flows.

FIG. 17 is a diagram showing the layout of a silicon chip formed by the SOI wafer 5. Halftone regions in FIG. 17 are regions of the N diffusion layers 11, 15 and 14 formed under the buried oxide film 10. There are four FBC 1 regions in the center to which $V_{PL}$ of −2V is applied. In three places each between neighboring FBC 1 regions, the NFET 2 region and the PFET 3 region are formed in stripes. $V_{PL}$ of −1V and $V_{PL}$ of 2.5V are applied to the NFET 2 region and the PFET 3 region, respectively. The NFET 2 region and the PFET 3 region are formed so as to surround the cell array.

Figure 18:
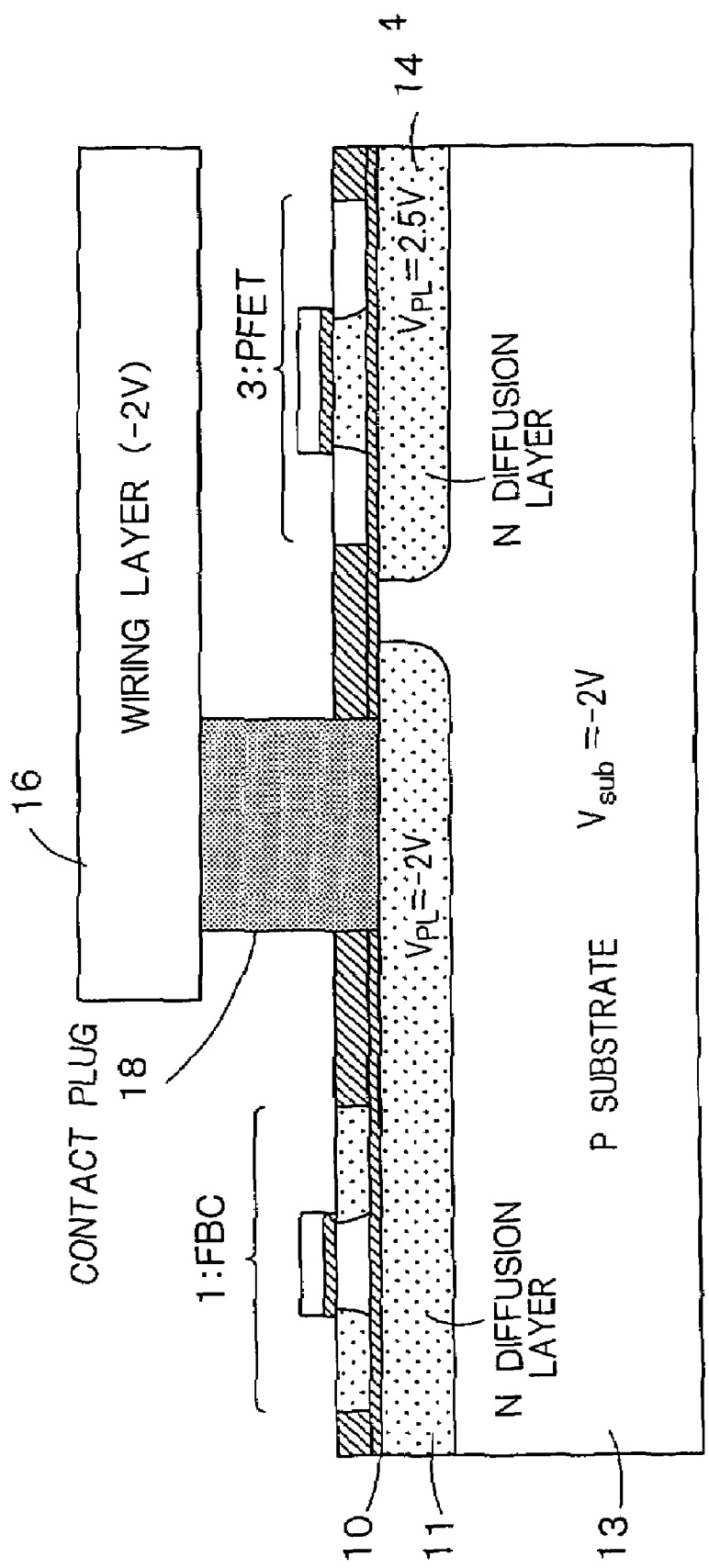
FIG. 18 is a cross section showing a portion of connection between an N-diffusion layer 11 and a wiring layer 16.

FIG. 18 is a cross section view showing a connection portion between the N diffusion layer 11 and a wiring layer 16. As shown in the diagram, the wiring layer 16 is formed on the SOI wafer 5. The wiring layer 16 and the N diffusion layer 11 are connected via a contact 18 extending from the surface of the SOI wafer 5 through the buried oxide film 10.

There are four ways of the plate potential $V_{PL}$ applied to the N diffusion layer 11; (1) the case where the plate potential $V_{PL}$ is applied from the outside of the chip, (2) the case where the plate potential $V_{PL}$ is generated in the chip, (3) the case where a mechanism capable of adjusting the plate potential $V_{PL}$ to a proper value at the time of die sorting and programming the proper value is implemented, and (4) the case where the plate potential $V_{PL}$ can be automatically adjusted in the chip.

Figure 19:
FIG. 19 is a diagram showing an example of supplying a plate voltage from a pad.

In the case (1), as shown in FIG. 19, a corresponding plate voltage $V_{PL}$ is applied from a pad 19 corresponding to each of the N diffusion layers.

Figure 20:
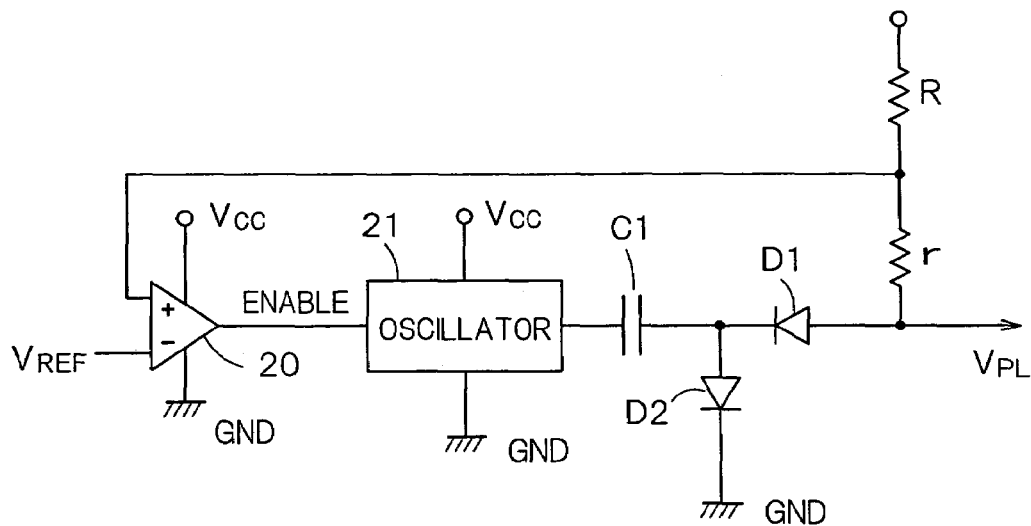
FIG. 20 is a diagram showing an example of setting the plate voltage to a fixed value generated in the chip.

FIG. 20 is a circuit diagram showing the case (2). The circuit is used in the case where $V_{PL}$ is lower than GND, that is, corresponds to the NFET 2 region. The circuit of FIG. 20 has an operational amplifier 20, an oscillator 21, a capacitor C1, diodes D1 and D2, and resistors R and r which are connected in series. The diodes D1 and D2 are cascaded between GND and $V_{PL}$. The capacitor C1 is connected between an output terminal of the oscillator 21 and the diodes D1 and D2, and a voltage at the connection point of the resistors R and r is connected to the positive input terminal of the operational amplifier 20. In the case where the $V_{PL}$ is higher than Vcc of 2.0V, the circuit diagram corresponding to the PFET 3 region is as shown in FIG. 21.

Figure 21:
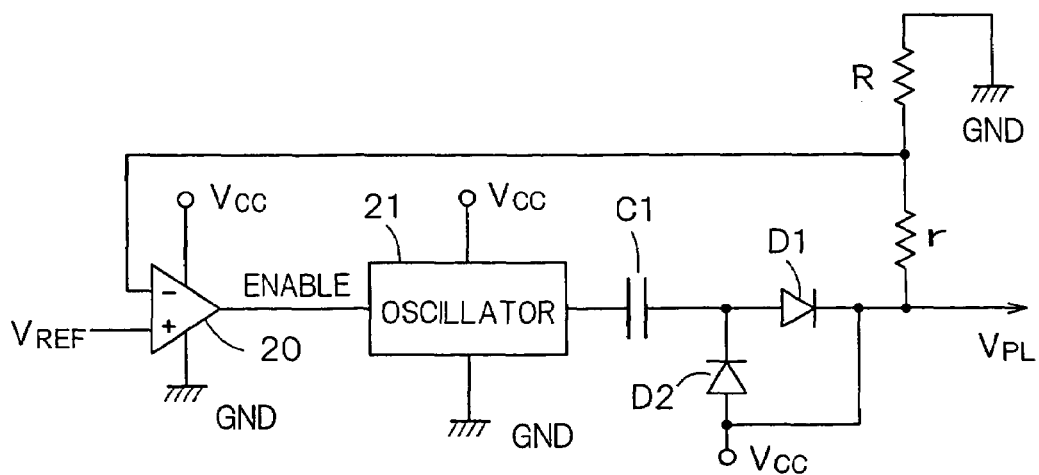
FIG. 21 is a circuit diagram showing a case where $V_{PL}$ is higher than Vcc=2.0V, that is, corresponding to the PFET 3 region.
Figure 22:
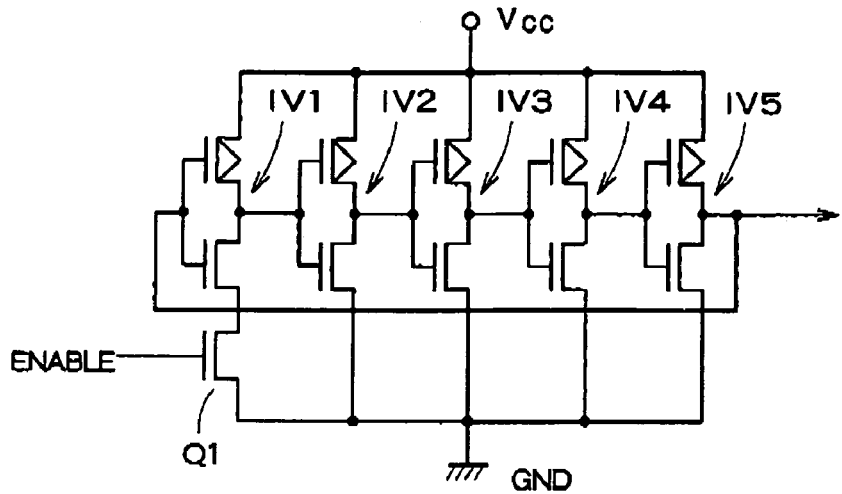
FIG. 22 is a circuit diagram showing a detailed configuration of an oscillator 21 in FIG. 20.

FIG. 22 is a circuit diagram showing the detailed configuration of the oscillator 21 in FIGS. 20 and 21. The oscillator 21 is a ring oscillator 21 having the CMOS configuration in which an odd number of inverters IV1 to IV5 each having a PMOS transistor and an NMOS transistor are cascaded and an output of the inverter IV5 at the final stage is fed back to the input of the inverter IV1 at the first stage. An NMOS transistor Q1 is connected between the NMOS transistor of the inverter IV1 at the first stage and a ground terminal. By an enable signal input to the gate of the NMOS transistor Q1, oscillation/stop of the ring oscillator 21 is controlled.

Figure 23:
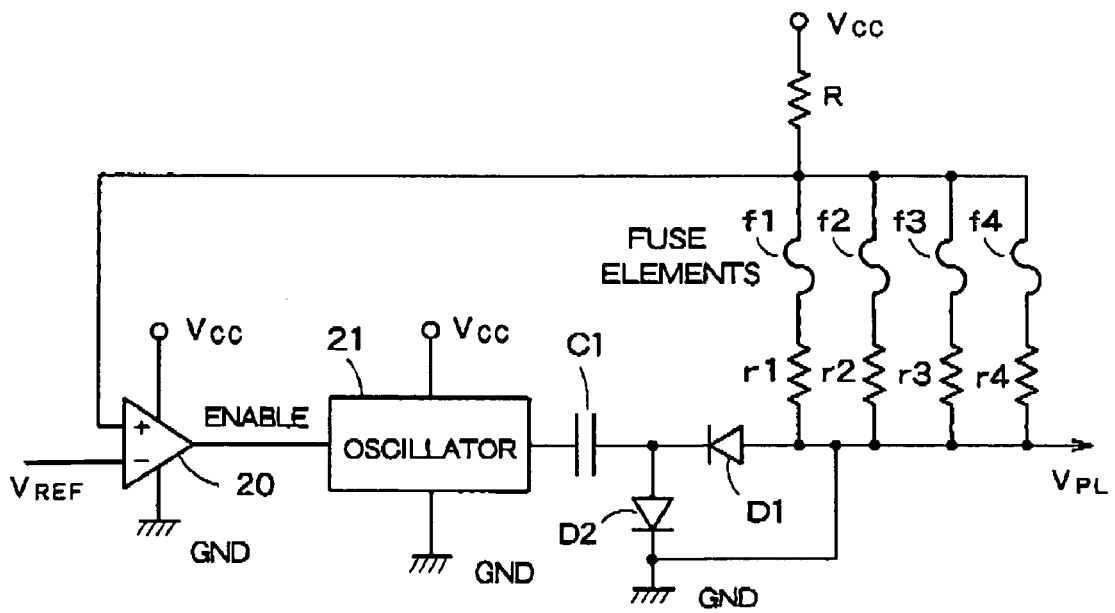
FIG. 23 is a circuit diagram showing an example of setting a plate voltage to a proper value at the time of die sorting.

FIG. 23 is a circuit diagram corresponding to FIG. 20 in the case of (3). A circuit of FIG. 23 has the operational amplifier 20, oscillator 21, capacitor C1, diodes D1 and D2, resistors r1 to r4 and R, and fuse devices f1 to f4. The fuse device f1 and the resistor r1 connected in series, the fuse device f2 and the resistor r2 connected in series, the fuse device f3 and the resistor r3 connected in series, and the fuse device f4 and the resistor r4 connected in series are connected in parallel. One end of each of the fuse devices f1 to f4 is connected to the resistor R, and one end of each of the resistors r1 to r4 is connected to $V_{PL}$.

If necessary, the fuse devices f1 to f4 are fused with a laser to select the resistors r1 to r4, thereby enabling $V_{PL}$ to be adjusted in accordance with the equation (1).

$$V_{PL}=\{(R+r)V_{REF}-rVcc\}/R \quad (1)$$

where r denotes combined resistance in the case where at least one of the resistors r1 to r4 is selected.

FIGS. 24 and 25 are circuit diagrams showing the case (4). FIG. 24 is a circuit diagram corresponding to the FBC 1 and NFET 2. FIG. 25 is a circuit diagram corresponding to the PFET 3.

In each of FIGS. 24 and 25, the operational amplifier 20, oscillator 21, capacitor c1, diodes D1 and D2, and a resistor γ are provided. $V_{PL}$ is applied to the plate of the FBC 1 or the NFET 2 in FIG. 24. $V_{PL}$ is applied to the plate of the PFET 3 in FIG. 25.

In each of FIGS. 24 and 25, the threshold voltage of each transistor is monitored by applying $V_{PL}$ to the plate, and $V_{PL}$ itself is changed by the threshold voltage.

In such a manner, even when the silicon film thickness $t_{si}$ and the gate insulation film $t_{ox}$ vary among chips and the threshold voltage is deviated from a design value, a feedback loop functions and the threshold value can be automatically set to the design value.

The plate of a MOSFET in the feedback loop is, desirably, isolated from the others for the reason that since the plate capacitance is too large, a time constant of the feedback loop is too high, it requires too much time to set the threshold voltage to a proper set value, and an oscillation phenomenon tends to occur. In the case of an FD-SOI having a thin silicon layer, an influence of variations of the thickness $t_{si}$ of the silicon layer among wafers exerted on the threshold voltage is large, so that the adjusting function is very important.

The substrate potential $V_{sub}$ is set to the lowest potential among three kinds of potentials $V_{PL}$ for the FBC, NFET, and PFET.

As described above, in one example of the first embodiment, the N diffusion layer 14 is provided below the PFET 3 and the P diffusion layer 12 is provided below the NFET 2. And these diffusion layers are biased to proper voltages independently. Consequently, the back channel of the NFET 2 and the PFET 3 can be turned off with reliability. Also in the case where the FBC 1 is disposed on the PD-SOI in which the buried oxide film (BOX) 10 is thick, the peripheral circuit 4 can be allowed to operate stably.

In the case where the thickness of a silicon film is reduced as an SOI transistor is becoming finer and the FD-SOI is used, the FBC 1 and the CMOS circuit can be made operate under the optimum operation conditions. According to the embodiment, variations in the threshold voltage of the transistor of the FD-SOI caused by fluctuations in the fabricating process are automatically adjusted. Stable operation of not only the FBC 1 but also the CMOS circuit can be assured.

Second Embodiment

According to a second embodiment, different from the first embodiment, the plate potentials of the FBC 1, NFET 2, and PFET 3 are applied by the P diffusion layer.

Figure 26:
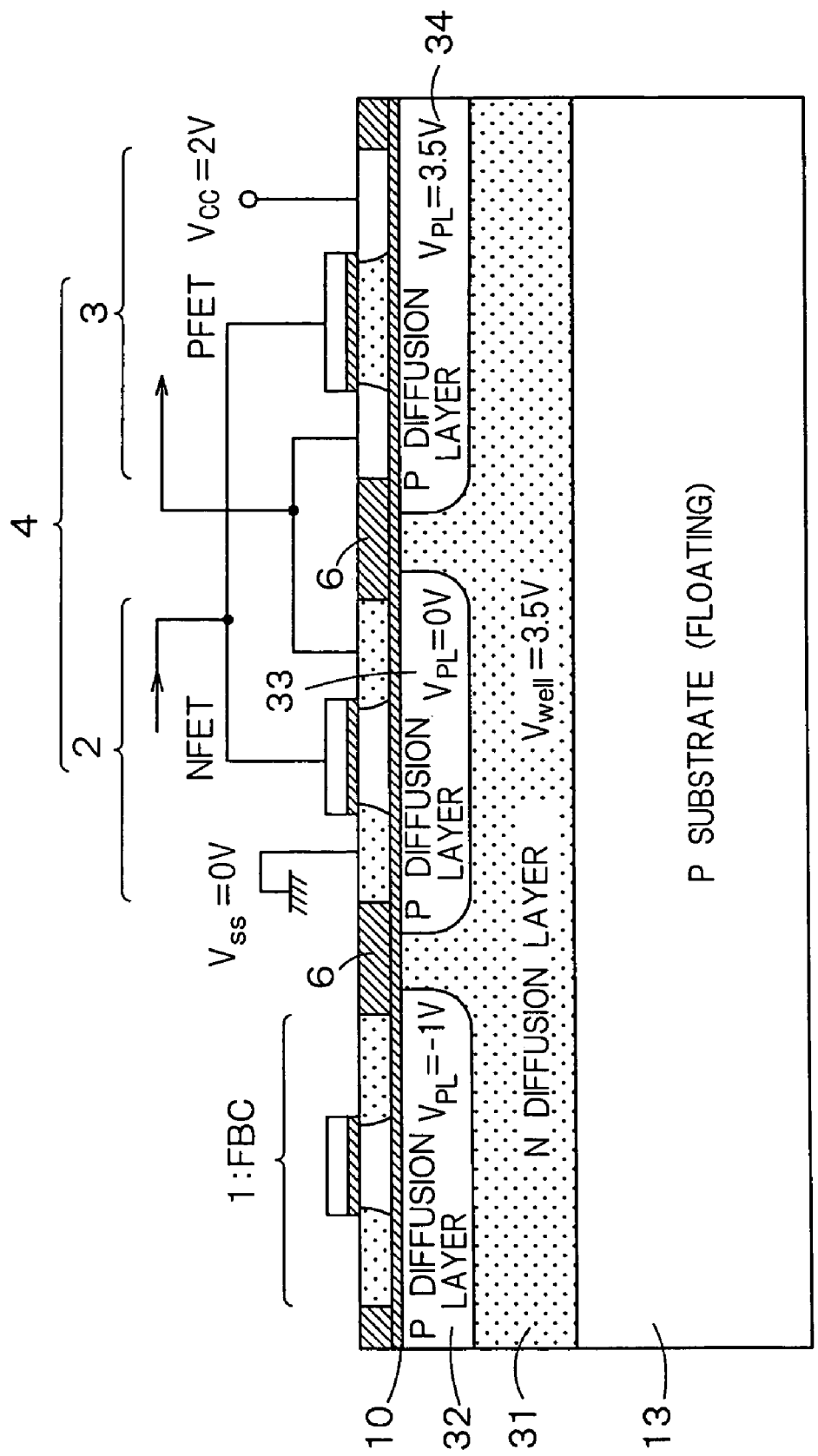
FIG. 26 is a cross section showing a second embodiment of a semiconductor storage device according to the invention.

FIG. 26 is a cross section showing the second embodiment of the semiconductor storage device according to the invention. The semiconductor storage device of FIG. 26 has an N diffusion layer (N-type well) 31 formed on the whole face of the P-type wafer 13, and a plurality of P diffusion layers 32, 33, and 34 formed in the N diffusion layer 31 by being separated from each other. The P diffusion layers 32, 33, and 34 are provided in correspondence with the FBC 1, NFET 2, and PFET 3, respectively. To the P diffusion layers 32, 33, and 34, plate potentials are supplied.

Due to the influence of the difference (1V) between the work function of N-type silicon and the work function of P-type silicon, to provide the same transistor characteristics as those of FIG. 16, each of the potentials applied to the P diffusion layers 32, 33, and 34 is higher than the corresponding potential in the case of FIG. 16 by 1V. To the N diffusion layer 31, the highest potential 0V among the potentials applied to the P diffusion layers 32 to 34 or a positive potential is applied. It is unnecessary to apply a potential to the P wafer 13 and is sufficient to float the potential.

Figure 27:
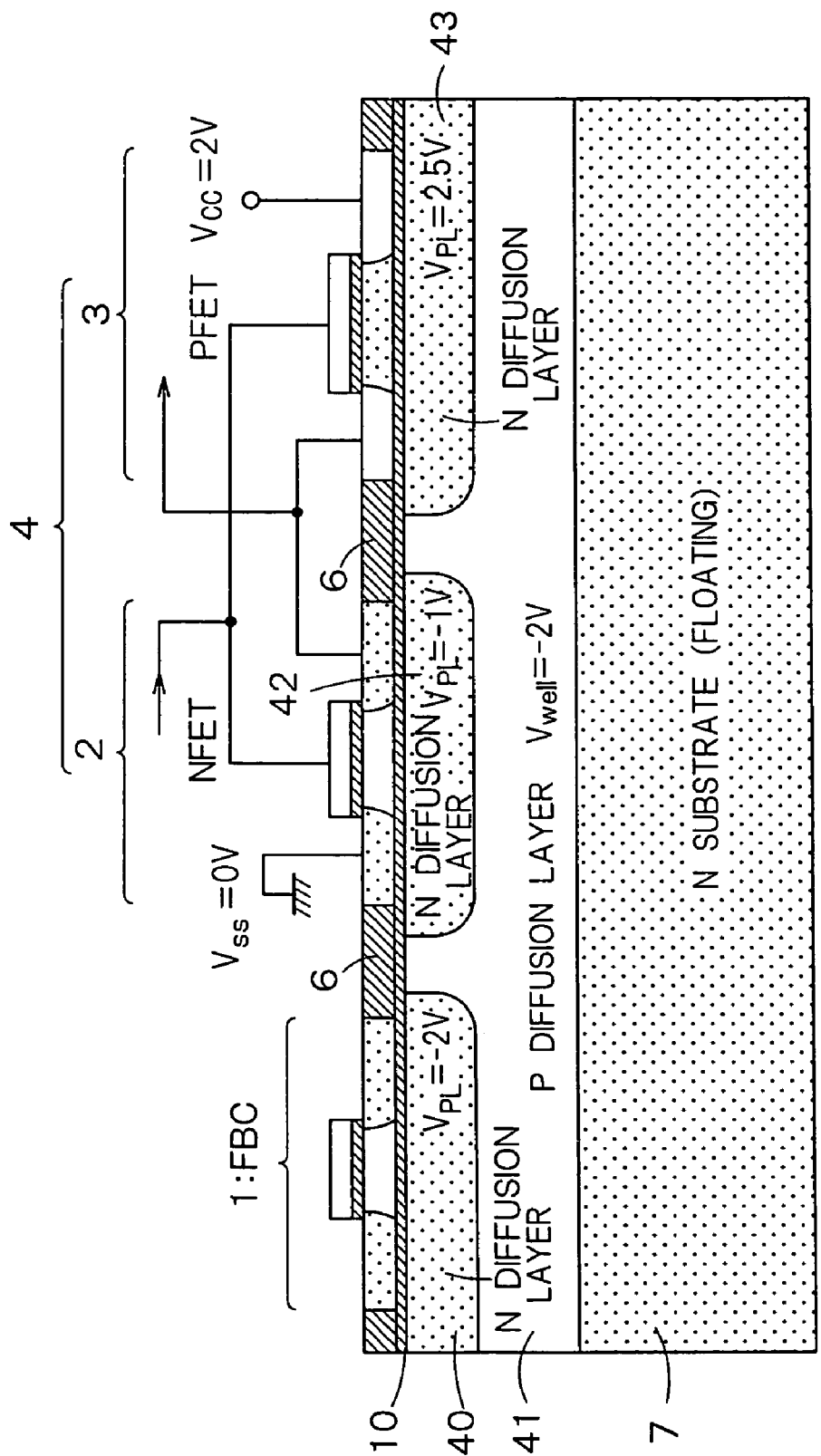
FIG. 27 is a cross section of a semiconductor storage device using an N substrate, which is a modification of FIG. 26.

FIG. 27 illustrates a modification of FIG. 26 using the N-type wafer 7. In the case of FIG. 27, a P diffusion layer 41 is formed on the top face of the N-type wafer 7. On the top face of the P diffusion layer 41, N diffusion layers 40, 42, and 43 are formed separate from each other. The N diffusion layers 40, 42, and 43 are provided in correspondence with the FBC 1, NFET 2, and PFET 3, respectively.

Figure 28:
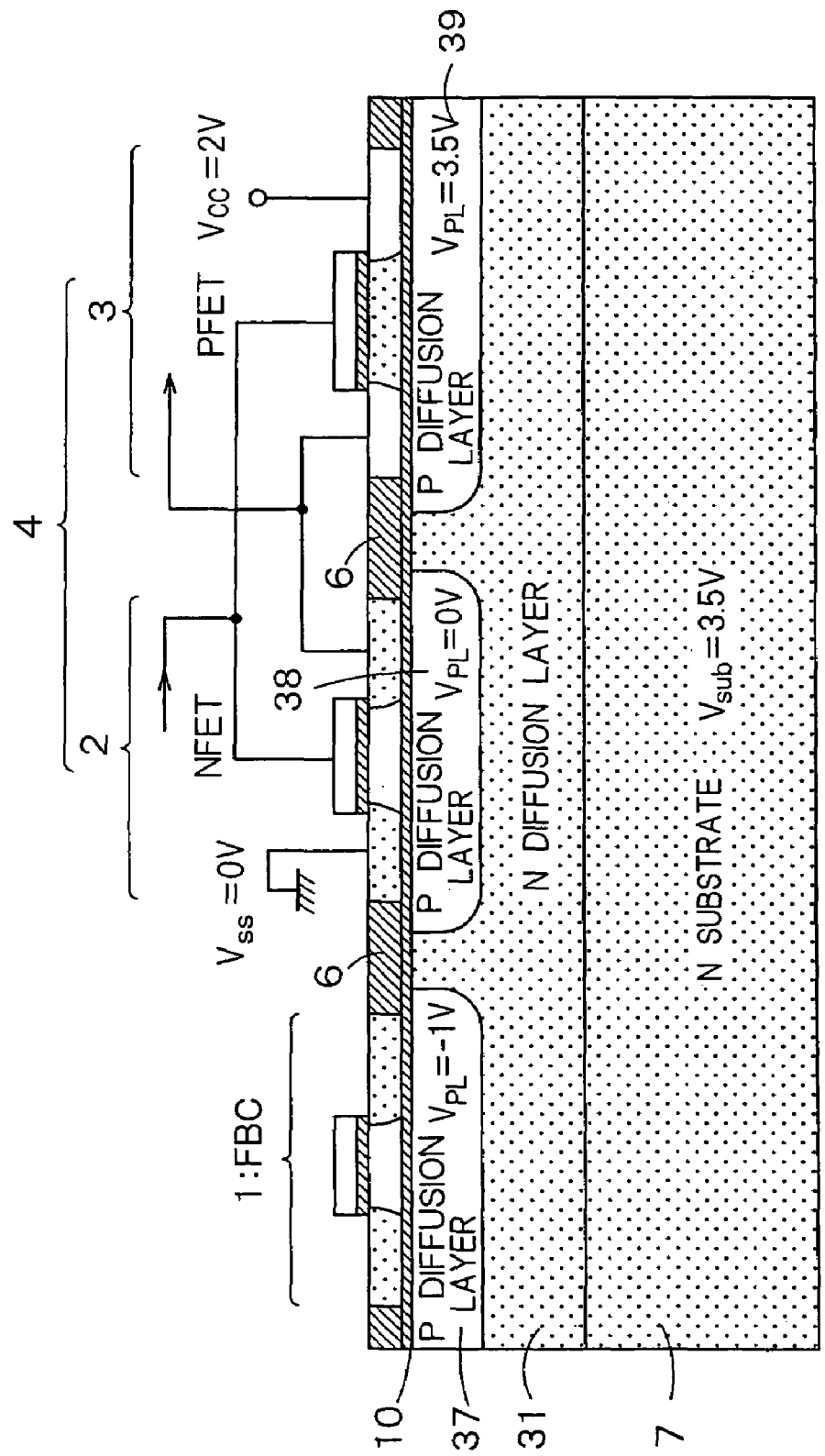
FIG. 28 is a cross section showing a modification of FIG. 26.

FIG. 28 is a cross section showing a modification of FIG. 26 and shows an example of using the N-type wafer 7 in place of the P-type wafer 13. Also in the example of FIG. 28, the following methods (1) to (4) of applying a substrate bias to each of the FBC 1, peripheral NFET 2, and peripheral PFET 3 can be employed.

(1) A substrate bias is applied from the outside of the chip. (2) A fixed value generated in the chip is applied. (3) The substrate bias is adjusted to a proper value at the time of die sorting and programmed. (4) The substrate bias is automatically adjusted in the chip.

The substrate potential $V_{sub}$ is set to the highest potential among three kinds of potentials $V_{PL}$ for the FBC, NFET, and PFET.

Third Embodiment

In a third embodiment, the plate potential of the FBC 1 is given by the P diffusion layer, and the plate potential of the NFET 2 and PFET 3 is given by the N diffusion layer.

FIG. 29 is a cross section view showing the third embodiment of the semiconductor storage device according to the invention. The semiconductor storage device has the P diffusion layer 41 formed on the whole top face of the P-type wafer 13, and N diffusion layers 42 and 43 which are formed on the P diffusion layer 41 by being separated from each other. The N diffusion layer 42 is formed below the NFET 2, and the N diffusion layer 43 is formed below the PFET 3. The same potential is applied to the P-type wafer 13 and the P diffusion layer 41.

By the influence of the difference of about 1V between the work function of the P type silicon and the work function of the N type silicon, in the case of FIG. 29, the potential higher than that in FIG. 16 by about 1V is applied to the P-type wafer 13, thereby realizing the FBC 1 having substantially the same characteristics. Therefore, in FIG. 29, to realize the FBC 1 having the same characteristics as those of the FBC 1 in FIG. 16, the voltage $V_{sub}$ of −1V has to be applied.

In the case of the embodiment as well, the substrate biases for the FBC 1, peripheral NFET 2, and peripheral PFET 3 can be applied by the following methods; (1) the substrate bias is applied from the outside of the chip, (2) a fixed value generated in the chip is applied, (3) the substrate bias is adjusted to a proper value at the time of die sorting and programmed, and (4) the substrate bias is automatically adjusted in the chip.

The substrate potential Vsub is set to the lowest potential among three kinds of potentials $V_{PL}$ for the FBC, NFET, and PFET.

Fourth Embodiment

In a fourth embodiment, the plate potential of the FBC 1 and the NFET 2 is given by the P diffusion layer, and the plate potential of the PFET 3 is given by the N diffusion layer.

Figure 30:
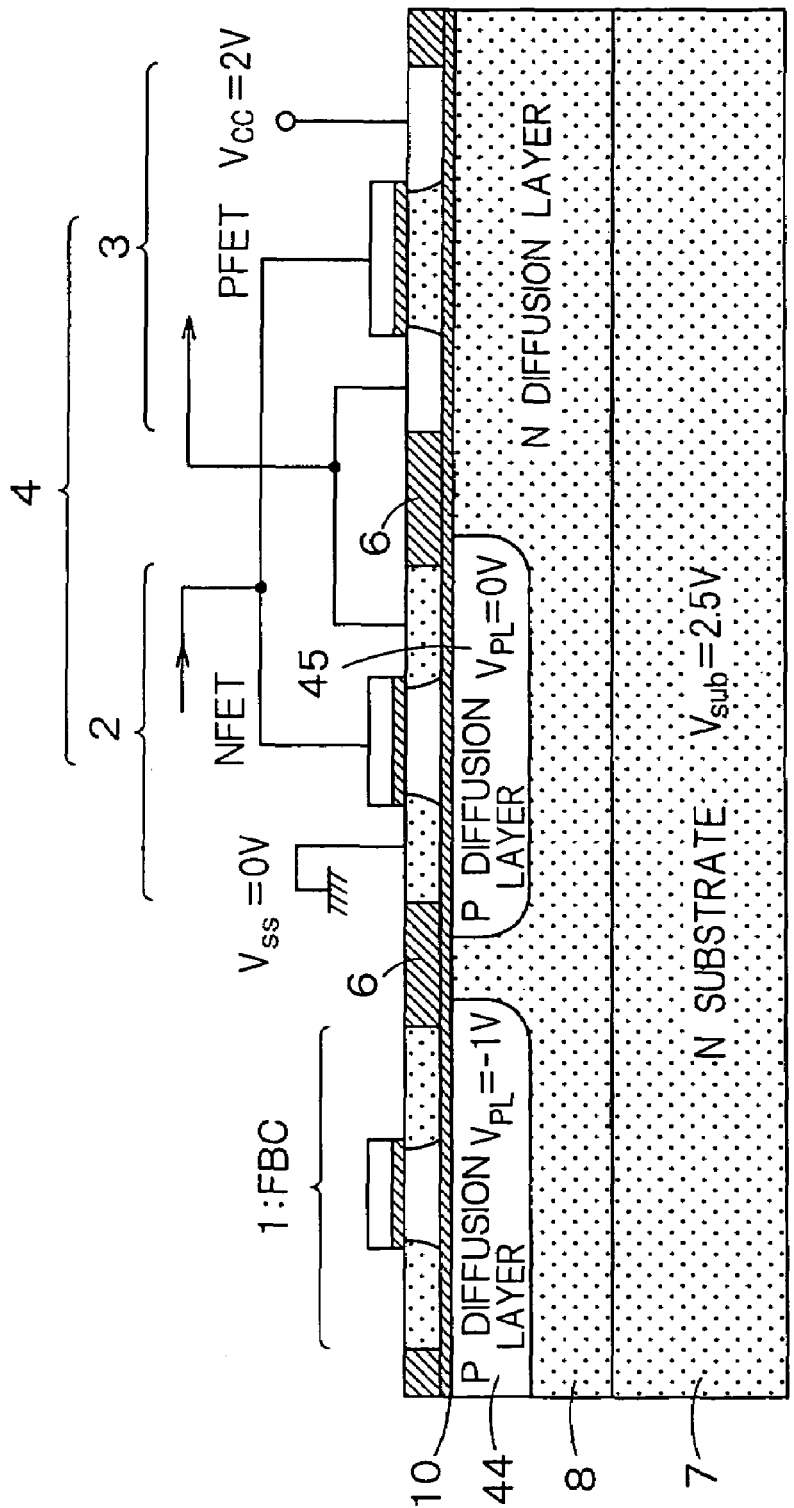
FIG. 30 is a cross section showing a fourth embodiment of the semiconductor storage device according to the invention.

FIG. 30 is a cross section view showing the fourth embodiment of the semiconductor storage device according to the invention. The semiconductor storage device of FIG. 30 has the N diffusion layer 8 formed on the whole top face of the N-type wafer 7, and a plurality of P diffusion layers 44 and 45 which are formed in a part of the N diffusion layer 8 by being separated from each other. The P diffusion layer 44 is formed below the FBC 1, and the P diffusion layer 45 is formed below the NFET 2.

To the N-type wafer 7, Vsub of 2.5V is applied, the P diffusion layer 44 is set to the $V_{PL}$ of −1V, and the P diffusion layer 45 is set to the $V_{PL}$ of 0V.

Also in the fourth embodiment, the substrate biases for the FBC 1, peripheral NFET 2, and peripheral PFET 3 can be applied by the following methods; (1) the substrate bias is applied from the outside of the chip, (2) a fixed value generated in the chip is applied, (3) the substrate bias is adjusted to a proper value at the time of die sorting and programmed, and (4) the substrate bias is automatically adjusted in the chip.

The substrate potential Vsub is set to the highest potential among three kinds of potentials $V_{PL}$ for the FBC, NFET, and PFET.

Fifth Embodiment

A fifth embodiment relates to a case of using the PD-SOI wafer 5 having a thick silicon layer.

Figure 31:
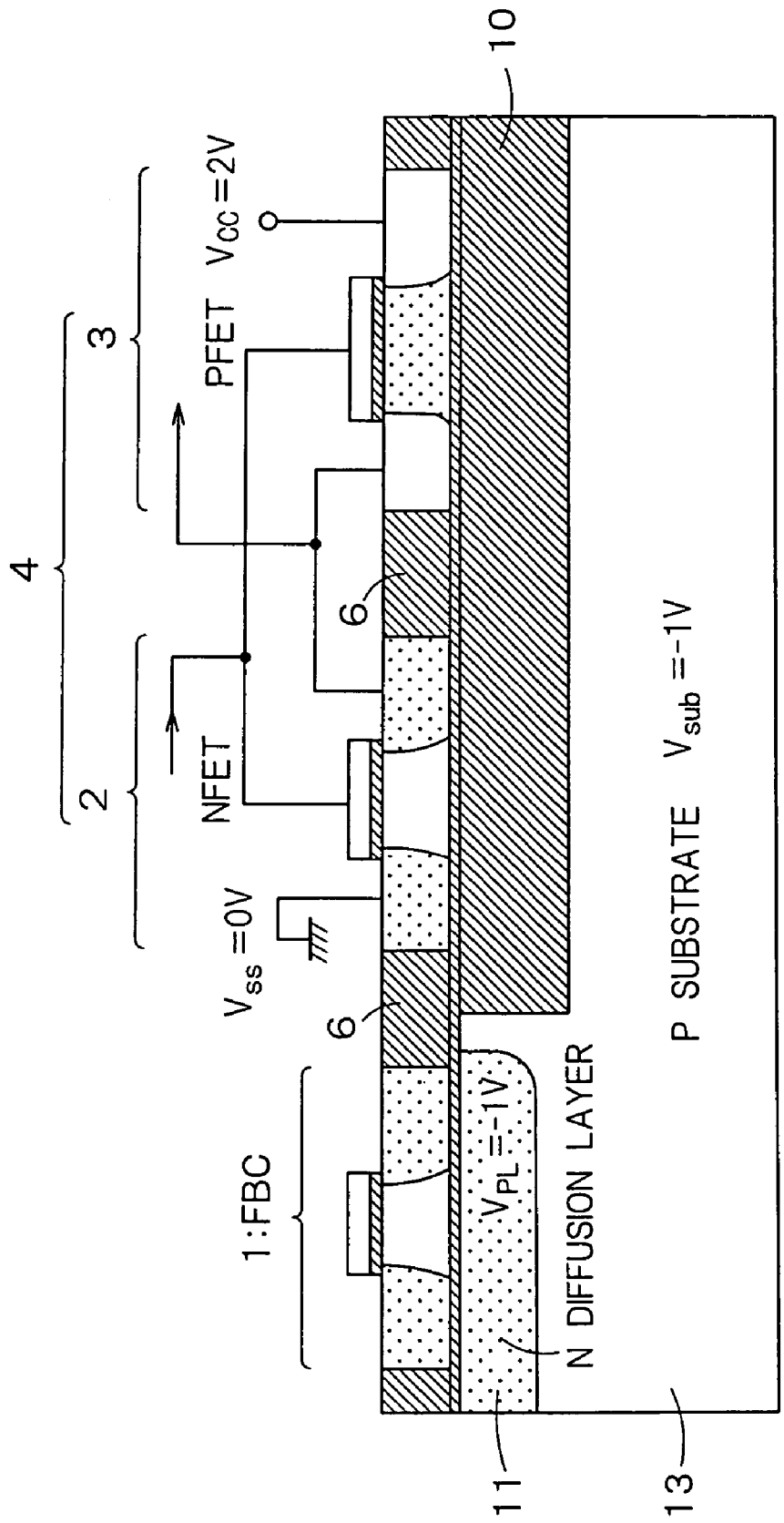
FIG. 31 is a cross section showing a fifth embodiment of the semiconductor storage device according to the invention.

FIG. 31 is a cross section view showing the fifth embodiment of the semiconductor storage device according to the invention and shows an example of the case where the thickness of the buried oxide film 10 in the FBC 1 is different from that in the peripheral circuit 4.

The semiconductor storage device of FIG. 31 has the buried oxide film 10 formed on the top face of the P-type wafer, and the N diffusion layer 11 formed in correspondence with the position of the FBC 1. The buried oxide film 10 is formed thick only in the portion of the peripheral circuit 4.

Since the buried oxide film 10 in the portion of the peripheral circuit 4 is formed thick, even the P-type wafer is set to −1V, there is no fear that the back channel of the PFET 3 is turned on.

In the case of the fifth embodiment as well, the substrate biases for the FBC 1, peripheral NFET 2, and peripheral PFET 3 can be applied by the following methods; (1) the substrate bias is applied from the outside of the chip, (2) a fixed value generated in the chip is applied, (3) the substrate bias is adjusted to a proper value at the time of die sorting and programmed, and (4) the substrate bias is automatically adjusted in the chip.

The substrate potential Vsub is set to the lowest potential among three kinds of potentials $V_{PL}$ for the FBC, NFET, and PFET.

Sixth Embodiment

In a sixth embodiment, in the case of using the PD-SOI wafer 5 having a thick silicon layer, all of devices can be set to the same substrate bias.

FIG. 32 is a cross section showing the sixth embodiment of the semiconductor storage device according to the invention. The semiconductor storage device of FIG. 32 has the P diffusion layer 41 formed on the whole top face of the P-type wafer, and the buried oxide film 10 formed on the top face of the P diffusion layer 41. The buried oxide film 10 is formed thick only in the portion of the peripheral circuit 4.

Seventh Embodiment

In a seventh embodiment, the portion of the FBC is on the FD-SOI and the peripheral circuit portion is on the PD-SOI.

Figure 33:
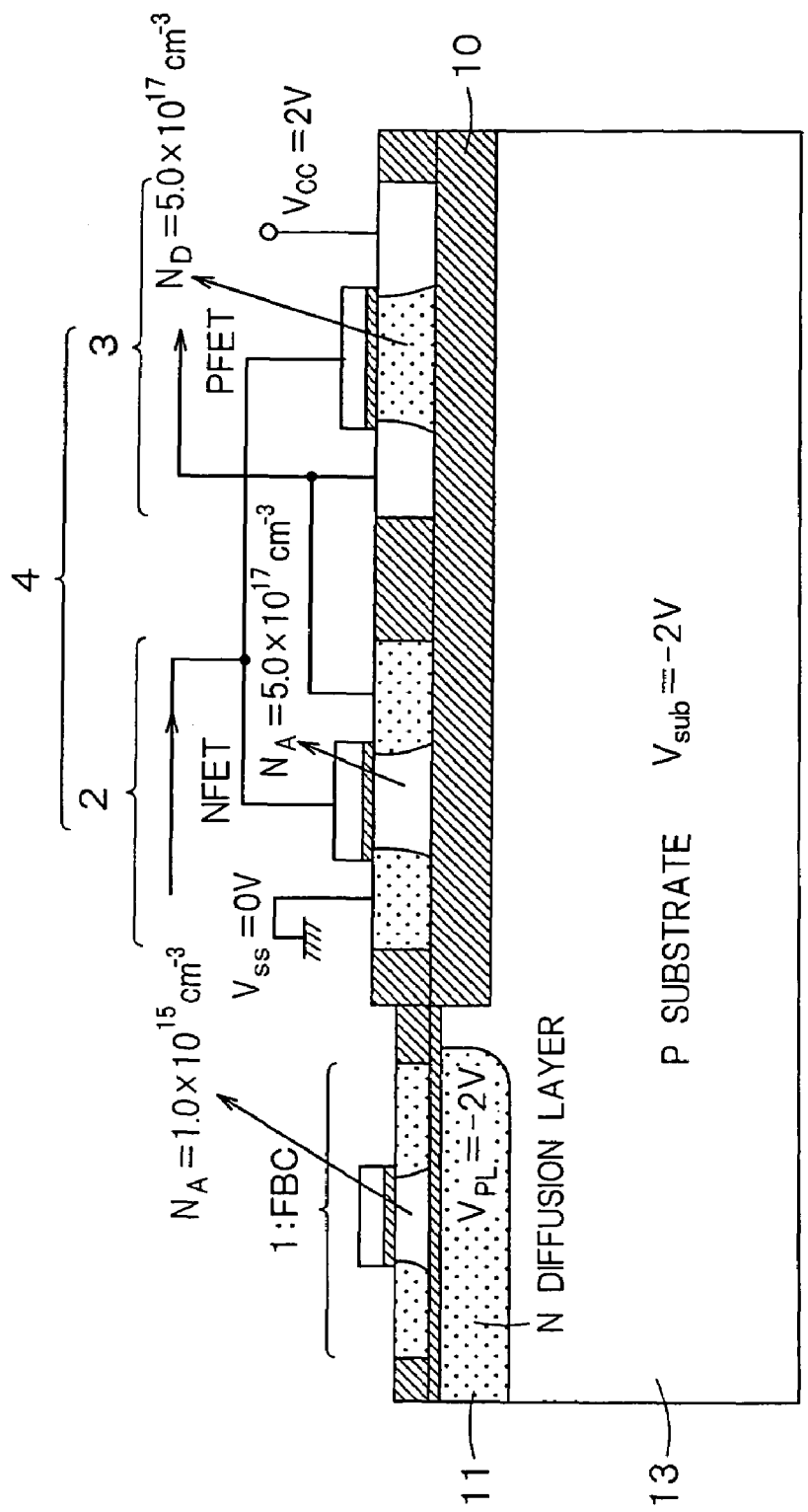
FIG. 33 is a cross section showing a seventh embodiment of the semiconductor storage device according to the invention.

FIG. 33 is a cross section showing the seventh embodiment of the semiconductor storage device according to the invention. The basic structure of the peripheral circuit portion of the semiconductor storage device of FIG. 33 is the same as that in FIG. 31, the concentration $N_A$ of the channel body of the FBC 1 is equal to $1.0 \times 10^{15}$ cm$^{-3}$, the concentration $N_A$ of the channel body of the NFET 2 is equal to $5.0 \times 10^{17}$ cm$^{-3}$, and the concentration $N_D$ of the channel body of the PFET 3 is equal to $5.0 \times 10^{17}$ cm$^{-3}$.

The FBC 1 is formed by the FD-SOI whereas the NFET 2 and the PFET 3 in the peripheral circuit 4 are formed by PD-SOI. The BOX is formed thin in the FBC 1 array portion and is formed thick in the peripheral circuit 4 portion.

With the configuration, the transistor characteristics of the peripheral circuit 4 do not depend on the substrate potential, and the plate potential of the FBC 1, −2V can be applied by the N diffusion layer.

Alternately, a sectional structure as shown in FIG. 34 may be also used in place of the structure shown in FIG. 33. In FIG. 34, the basic structure is the same as that in FIG. 33. The plate potential of the FBC 1 is given by the P-type diffusion layer, and Vsub is equal to −1V.

In the foregoing embodiment, the case where a set of VCC (=2.0V) and VSS (=0V) is used as the power source voltages of the peripheral circuit 4 has been described. The invention is also applicable to the case where a plurality of sets of power source voltages are provided. In this case, it is sufficient to employ a configuration in which the diffusion layer under the buried oxide film (BOX) 10 is isolated for each power source voltage and an optimum voltage is applied.

In the foregoing embodiments, a potential is applied by a diffusion layer below the buried oxide film (BOX) 10. However, the invention is not limited to the structure. For example, a potential may be applied by a polysilicon layer in which an N-type impurity or P-type impurity is implanted.

Figure 35:
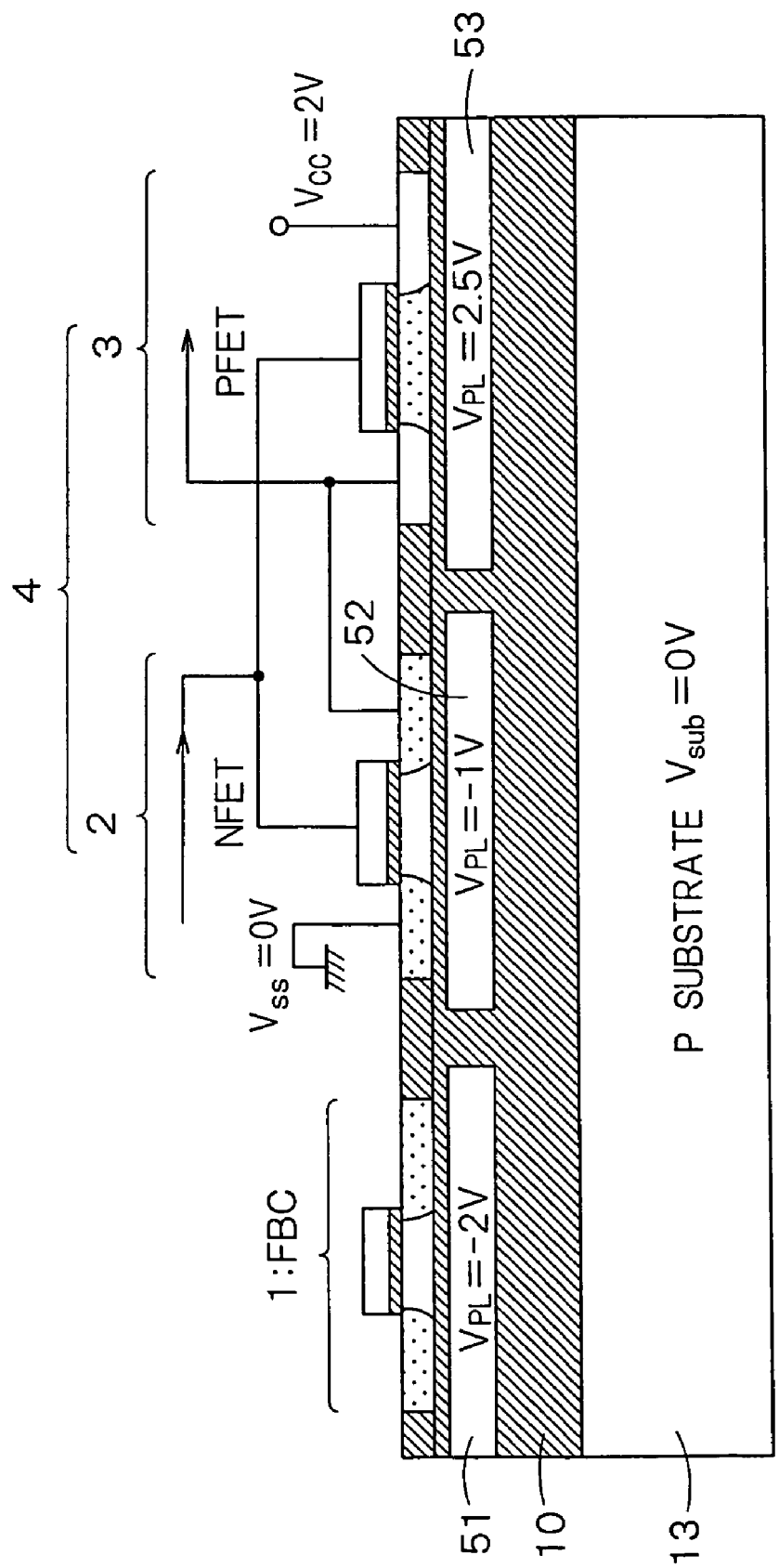
FIG. 35 is a cross section showing a case where plates 51, 52, and 53 made of P-type or N-type polysilicon or a metal are buried in a buried oxide film 10.

Further, as shown in FIG. 35, it is also possible to bury plates 51, 52, and 53 made of P-type or N-type polysilicon or a metal in the buried oxide film 10 and to apply a potential. In the example of FIG. 35, $V_{PL}$ of −2V is applied to the plate 51 made of the N-type polysilicon below the FBC 1, $V_{PL}$ of −1V is applied to the plate 52 below the NFET 2, and $V_{PL}$ of 2.5V is applied to the plate 53 below the PFET 3.

The plate 51 below the FBC 1 may be disposed on an array unit basis. Alternately, the embodiment can be also applied to the FBC 1 having a double-gate structure in which a plate is provided along each word line.

Although the semiconductor storage device having the FBC 1 has been described in each of the foregoing embodiments, the invention is also applicable to a semiconductor integrated circuit which does not have the FBC 1.

What is claimed is:

1. A semiconductor storage device, comprising:
    a first semiconductor layer formed on a silicon substrate via a buried insulation layer,
    an FBC (Floating Body Cell) having a first channel body of floating type formed on the first semiconductor layer, a main gate which forms a channel at a first face side of the channel body, and an auxiliary gate formed to capacitively couple on a second face at an opposite side of the first face;
    a logic circuit formed on the first semiconductor layer, separate from the FBC by an insulation film, which transfers a signal for the FBC;
    a second semiconductor layer located below the FBC and formed along an under face of the buried insulation film; and
    a third semiconductor layer located below the logic circuit and formed along an under face of the buried insulation film,
    wherein the second and third semiconductor layers are set to be at different potentials from each other.

2. The semiconductor storage device according to claim 1, wherein the second semiconductor layer is the same conductive type as that of the first channel body.

3. The semiconductor storage device according to claim 1, wherein the logic circuit has a second channel body in which a channel is formed; and
    the third semiconductor layer is the same conductive type as that of the second channel body.

4. The semiconductor storage device according to claim 1, wherein the main gate is formed of a semiconductor in which impurity atoms are introduced, and the second semiconductor layer is a conductive type different from that of the main gate.

5. The semiconductor storage device according to claim 1, wherein the logic circuit includes:
a second channel body in which a channel is formed; and
a logic circuit gate formed of a semiconductor in which impurity atoms are introduced, said logic circuit forming a channel in the second channel body,
the third semiconductor layer being a conductive type different from that of the logic circuit gate.

6. The semiconductor storage device according to claim 1, wherein the logic circuit is a CMOS circuit having a PMOSFET and an NMOSFET;
the third semiconductor layer has fourth and fifth semiconductor layers formed separate from each other;
the fourth semiconductor layer is located below the PMOSFET, and is formed on an under face of the buried insulation film;
the fifth semiconductor layer is located below the NMOSFET, and is formed on an under face of the buried insulation film; and
the second, fourth and fifth semiconductor layers are set to be at different potentials from each other.

7. The semiconductor storage device according to claim 6, wherein the silicon substrate is n-type;
the second and fifth semiconductor layers are p-type; and
the fourth semiconductor layer is n-type.

8. The semiconductor storage device according to claim 6, wherein the silicon substrate is p-type;
the second semiconductor layer is n-type; and
the fourth and fifth semiconductor layers are p-type.

9. The semiconductor storage device according to claim 6, wherein the silicon substrate is p-type;
the second and fourth semiconductor layers are n-type; and
the fifth semiconductor layer is p-type.

10. The semiconductor storage device according to claim 6, wherein the silicon substrate is p-type;
the second semiconductor layer is p-type; and
the fourth and fifth semiconductor layers are n-type.

11. The semiconductor storage device according to claim 6, wherein the silicon substrate is n-type;
the second and fifth semiconductor layers are p-type; and
the fourth semiconductor layer is n-type.

12. The semiconductor storage device according to claim 1, further comprising
an automatic adjusting circuit configured to monitor threshold voltages of the FBC or the logic circuit by setting plate voltages of the FBC or the logic circuit as voltages of the second or third semiconductor layers, and to adjust voltages of the second or third semiconductor layers based on the monitored result to allow the threshold voltages to coincide with designed voltages.

* * * * *